(12) United States Patent
Sokolov et al.

(10) Patent No.: US 10,581,435 B1
(45) Date of Patent: Mar. 3, 2020

(54) ASYNCHRONOUS CIRCUIT

(71) Applicant: Dialog Semiconductor (UK) Limited, London (GB)

(72) Inventors: Danil Sokolov, Newcastle upon Tyne (GB); Viktor Khomenko, Newcastle upon Tyne (GB); Alex Yakovlev, Newcastle upon Tyne (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/353,023

(22) Filed: Mar. 14, 2019

(51) Int. Cl.
*H03K 19/20* (2006.01)
*H03K 19/0948* (2006.01)
*G01K 1/02* (2006.01)
*G01R 27/26* (2006.01)
*G01R 19/00* (2006.01)

(52) U.S. Cl.
CPC ............ *H03K 19/20* (2013.01); *G01K 1/026* (2013.01); *G01R 19/0038* (2013.01); *G01R 27/2605* (2013.01); *H03K 19/0948* (2013.01)

(58) Field of Classification Search
None
See application file for complete search history.

(56) References Cited

U.S. PATENT DOCUMENTS

| | | | |
|---|---|---|---|
| 3,824,409 A | 7/1974 | Patil | |
| 5,404,556 A * | 4/1995 | Mahowald | G06F 13/36 706/41 |
| 5,875,339 A | 2/1999 | Molnar et al. | |
| 9,626,317 B2 * | 4/2017 | Bacigalupo | G06F 13/364 |
| 2009/0024777 A1 * | 1/2009 | Hirotsu | G06F 13/366 710/116 |
| 2011/0121857 A1 * | 5/2011 | Nowick | H03K 19/173 326/54 |
| 2014/0064096 A1 * | 3/2014 | Stevens | H04L 47/12 370/236 |

OTHER PUBLICATIONS

"Low Power Voltage Sensing Through Capacitance to Digital Conversion," by Delong Shang et al., 2016 IEEE 19th International Symposium on Design and Diagnostics of Electronic Circuits & Systems (DDECS), Apr. 20, 2016, 6 pages.

(Continued)

*Primary Examiner* — Minh D A
*Assistant Examiner* — James H Cho
(74) *Attorney, Agent, or Firm* — Saile Ackerman LLC; Stephen B. Ackerman

(57) ABSTRACT

An asynchronous circuit and methods for requesting that an action is triggered. The circuit performs the following steps: 1) receive a plurality of input signals, the input signals each having a first transition between states at a different time, 2) select one of the input signals based on the time of its first transition compared to the time of the first transition of the other input signals, 3) provide a request to an action block to: i) trigger the action in response to receiving the request, and ii) to provide an acknowledgement upon completion of the action, wherein the request and the action are dependent on the input signal that was selected, 4) receive the acknowledgement from the action block, and 5) initiate steps 1) to 4) for a second transition of the input signals after the plurality of input signals have undergone their first transitions.

25 Claims, 19 Drawing Sheets

(56) References Cited

OTHER PUBLICATIONS

"Fast Capacitance-to-Digital Converter with Internal Reference," by Kaiyuan Gao et al., 2016 IEEE Biomedical Circuits and Systems Conference (BioCAS), Jan. 26, 2017, pp. 264-267.
Ideas about Arbiters, by Charles L. Seitz, LAMBDA First Quarter 1980, pp. 10-14.
Synchronization and Arbitration in Digital Systems by David J. Kinniment, John Wiley & Sons Publishing, Copyright 2007, pp. 208-223.
"A 0.7pF-to-10nF Fully Digital Capacitance-to-Digital Converter Using Iterative Delay-Chain Discharge," by Wanyeong Jung et al., ISSCC 2015 / Session 27 / Physical Sensors / 27.6, IEEE International Solid-State Circuits Conference, Feb. 22, 2015, pp. 484-486.
"A Smart All-Digital Charge to Digital Converter," by Y. Xu et al., 2016 IEEE International Conference on Electronics, Circuits and Systems (ICECS), Dec. 11, 2016, pp. 668-671.

* cited by examiner

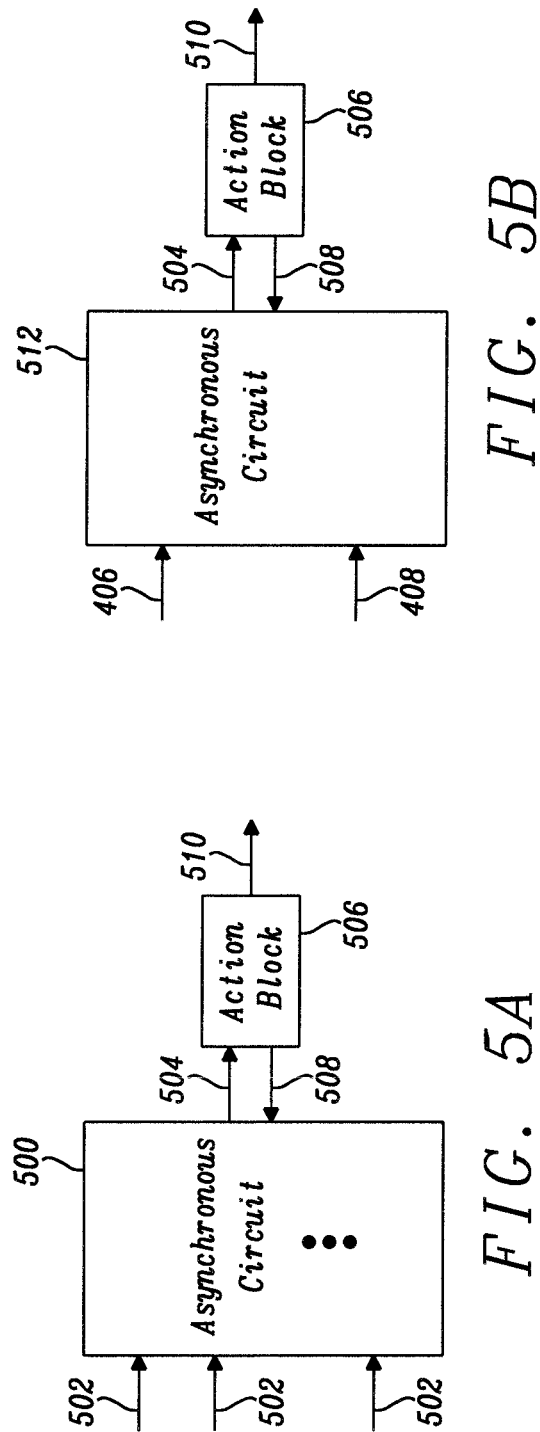

ASYNCHRONOUS CIRCUIT

The present disclosure relates to an asynchronous circuit. In particular the present disclosure relates to an asynchronous circuit for requesting that an action is triggered.

BACKGROUND

An output signal of a logic gate will exhibit a delay when compared to an input digital signal received by the logic gate. For example, if an input digital signal being received by a logic gate undergoes a transition, there will be a finite time period (a delay) before the transition of the input digital signal has an impact on the output signal. When modelling such gates by following the classical Muller's approach, a logic gate is regarded as an atomic evaluator of a Boolean function with a delay associated with its output. A logic gate may alternatively be referred to as a logic block.

Behaviour of an asynchronous circuit may be specified using a Signal Transition Graphs (STG). STGs are a type of Petri net in which transitions are labelled with the rising edges (denoted by a "+") and falling edges (denoted by a "−") of circuit signals. FIG. 1 is an STG showing a causality relation 100, a concurrency relation 102 and a conflict relation 104.

A Petri net, for example of the type shown in FIG. 1, is a directed graph with two types of nodes: places and transitions. Places are represented by circles (for example 106) and transitions are represented by textual labels (for example 108). Places can be connected to transitions by means of consuming arcs, and transitions can be connected to places by producing arcs. Producing and consuming arcs are denoted by arrows (for example 110).

The state of a Petri net is determined by its marking. Marking is characterised by the number of tokens in a specific place of the Petri net. A token is typically denoted by a dot (for example 112). The marking of a Petri net can evolve by means of a token game whose rules are as follows. A transition having all preceding places marked becomes enabled. An enabled transition may eventually fire by reducing the number of tokens in every preceding place by one and increase the number of tokens in every succeeding place by one as an atomic action. This firing leads to a new marking which defines the next state of the Petri net.

For simplicity, places with one consuming arc and one producing arc are often hidden, allowing arcs (with implicit places) directly between pairs of transitions. STGs are a convenient model for capturing causality (order of events), concurrency (interleaving of independent events) and conflict (choice of one scenario from several possibilities) relations on circuit signals, as shown in FIG. 1.

Interpretation of STGs of the type presented herein will be well understood by the skilled person.

A delay comparator is a type of circuit that may be used to compare the relative timing of events. For example, a delay comparator receiving two digital input signals exhibiting transitions at different times can be used to identify which digital input signal transitioned first.

FIG. 2 is a schematic of a capacitance to digital converter (CDC) 200 using iterative delay chain discharge and comprising a delay comparator 202 (Wanyeong Jung et. al., A 0.7 pF-to-10 nF Fully Digital Capacitance-to-Digital Converter Using Iterative Delay-Chain Discharge, ISSCC 2015/Session 27/Physical Sensors/27.6). FIG. 3 is a further schematic of the delay comparator 202. The delay comparator comprises inverters 204, 206, 208, 210, NAND gates 212, 214, 216 and an XOR gate 218. The delay comparator 202 receives the two signals V_SENSE_Delay and V_LOW_Delay at inputs of the inverters 204 and 206, respectively, and the delay comparator 202 provides an output Y at an output of the NAND gate 216. NAND gate 216 also receives a signal Output_Enable and XOR gate 218 output a signal Done. Output Y is dependent on the relative timing of the delays of V_SENSE_Delay and V_LOW_Delay.

The delay comparator 202 requires that both signals V_SENSE_Delay and V_LOW_Delay have undergone and completed their transitions for a pulse to be provided on output Y. Therefore a single transitioning signal is insufficient to provide a pulse on the output Y.

Known systems implementing capacitance and voltage conversion to digital code are presented in Delong Shang et. al., Low Power Voltage Sensing Through Capacitance to Digital Conversion, Proc. Int. Symp. on Design and Diagnostics of Electronics Circuits & Systems (DDECS), 2016; Kaiyuan Gao et. al., Fast Capacitance-to-Digital Converter with Internal Reference, Proc. IEEE Biomedical Circuits and Systems Conference (BioCAS), 2016; and Y. Xu et. al., A Smart All-Digital Charge to Digital Converter, Proc. International Conference on Electronics Circuits and Systems (ICECS), pp. 668-671, 2016. These known systems comprise components exhibiting similar functionality to the delay comparator 202.

An asynchronous arbiter, for example as shown in C. Seitz, Ideas about arbiters, Lambda pp 10-14, 1980; and D. Kinniment, Synchronization and arbitration in digital systems, Wiley Publishing, 2008 may be used to receive multiple input signals that exhibit transitions between high and low states. The asynchronous arbiter is used to select one of the input signals and to provide an output that is associated with the selected input signal. For example, if one of the input signals undergoes frequent transitions where each transition has an associated output, and the other input signal is dormant (and exhibit no transitions), then the asynchronous arbiter will provide the outputs associated with the frequently transitioning input signal every time; the dormant input signal will be ignored. However, if both input signals exhibit transitions at a similar time, then the asynchronous arbiter will decide which input signal is to be selected, and its associated output provided, first. A "fair" arbiter provides the associated output of the input signal that was not selected after the associated output of the selected input signal has been provided. The asynchronous arbiter has a different purpose and different protocol from a delay comparator. Additionally, it is not well-suited for making repeated comparisons of the relative timing of events.

SUMMARY

It is desirable to provide an asynchronous circuit that overcomes or mitigates one or more of the above-mentioned problems.

According to a first aspect of the disclosure there is provided an asynchronous circuit for requesting that an action is triggered, and configured to perform the following steps: 1) receive a plurality of input signals, the input signals each having a first transition between states at a different time, 2) select one of the input signals based on the time of its first transition compared to the time of the first transition of the other input signals, 3) provide a request to an action block that is configured to: i) trigger the action in response to receiving the request, and ii) to provide an acknowledgement upon completion of the action, wherein the request and the action are dependent on the input signal that was selected, 4) receive the acknowledgement from the action block, and 5) initiate steps 1) to 4) for a second transition of the input signals after the plurality of input signals have undergone their first transitions.

Optionally, in step 3), the request is provided to the action block before any of the other input signals have undergone their first transitions.

Optionally, each input signal is received from a logic block.

Optionally, a digital go signal that exhibits a first transition between states is provided to the logic blocks, and the digital go signal is used to generate each of the input signals, such that each of the input signals corresponds to the digital go signal with a delayed first transition resulting from the logic block that outputs the input signal.

Optionally, the digital go signal is provided from the asynchronous circuit.

Optionally, each input signal is received from a logic block, a digital go signal that exhibits a first transition between states is provided to the logic blocks, the digital go signal is used to generate each of the input signals, such that each of the input signals corresponds to the digital go signal with a delayed first transition resulting from the logic block that outputs the input signal, and the digital go signal exhibits a second transition after all input signals have undergone their first transitions, thereby providing the second transitions of the plurality of input signals.

Optionally, the digital go signal is provided from the asynchronous circuit.

Optionally, the input signal that is selected is a first transitioning input signal, corresponding to: i) the input signal that has a first transition between states in a time period that exceeds a threshold delay period before the other input signals undergo their first transitions, or ii) the input signal arbitrarily selected from two or more input signals that have first transitions between states before the other input signals, where the time period between the first transitions of the two or more input signals is less that the threshold delay period.

Optionally, the asynchronous circuit comprises a mutex element configured to arbitrarily select the first transitioning input signal from two or more input signals that have first transitions between states before the other input signals, where the time period between the first transitions of the two or more input signals is less that the threshold delay period.

Optionally, after selection of the first transitioning input signal, the other input signals are not provided to the mutex element.

Optionally, upon initiating step 3) for the second transition of the input signals: if a different action is to be triggered from a previously triggered action and the acknowledgement indicating that the previously triggered action has completed has not been received, the different action is triggered while the previously triggered action is in process, and/or if a same action is to be triggered as the previously triggered action and the acknowledgement indicating that the previously triggered action has completed has not been received, the action is repeated upon completion of the previously triggered action.

Optionally, the action is deemed completed after the action has been in progress for a time period that exceeds a threshold action period.

According to a second aspect of the disclosure there is provided a digital sensor for comparing a plurality of analog values, the digital sensor comprising an asynchronous circuit for requesting that an action is triggered, and configured to perform the following steps: 1) receive a plurality of input signals, the input signals each having a first transition between states at a different time, 2) select one of the input signals based on the time of its first transition compared to the time of the first transition of the other input signals, 3) provide a request to an action block that is configured to: i) trigger the action in response to receiving the request, and ii) to provide an acknowledgement upon completion of the action; wherein: the request and the action are dependent on the input signal that was selected, 4) receive the acknowledgement from the action block, and 5) initiate steps 1) to 4) for a second transition of the input signals after the plurality of input signals have undergone their first transitions, wherein each input signal is received from a logic block, a digital go signal that exhibits a first transition between states is provided to the logic blocks, and the digital go signal is used to generate each of the input signals, such that each of the input signals corresponds to the digital go signal with a delayed first transition resulting from the logic block that outputs the input signal, and each of the logic blocks is configured to receive one of the analog values to be compared, the delayed first transition of the input signal provided by each logic block being dependent on the analog value received by that logic block, such that the delayed first transitions of the input signals are suitable for comparing each of the analog values.

Optionally, in step 3), the request is provided to the action block before any of the other input signals have undergone their first transitions.

Optionally, the analog values comprise at least one of voltages, capacitances and temperatures.

Optionally, the analog values comprise voltages comprising a first voltage and a reference voltage, the plurality of input signals comprises a first input signal and a second input signal, the first input signal being received from a first logic block and the second input signal being received from a second logic block, the first logic block is coupled to a capacitor, the capacitor having a capacitor voltage initially proportional to the first voltage, the delayed first transition of the first input signal being dependent on the capacitor voltage, the second logic block is coupled to the reference voltage, the delayed first transition of the second input signal being dependent on the reference voltage, the action triggered by selection of the first input signal is the incrementation of a counter and the partial discharge of the capacitor, the asynchronous circuit is configured to initiate steps 1) to 4) for one or more later transitions of each of the input signals after the plurality of input signals have undergone their first transitions, and the number of increments recorded by the counter is suitable for measuring the first voltage.

Optionally, the analog values comprise voltages, each logic block is coupled to one of the voltages to be compared, and the action triggered with the selection of each transitioning input signal is a recording of that input signal having transitioned.

Optionally, the analog values comprise capacitances comprising a first capacitance and a second capacitance, the plurality of input signals comprises a first input signal and a second input signal, the first input signal being received from a first logic block and the second input signal being received from a second logic block, the first logic block is coupled to a first capacitor, the first capacitor having the first capacitance and being configured to hold a first capacitor voltage, the delayed first transition of the first input signal being dependent on the first capacitor voltage, the second logic block is coupled to a second capacitor, the second capacitor being configured to hold a second capacitor voltage, the delayed first transition of the second input signal being dependent on the second capacitor voltage, the action triggered by selection of the first input signal is recording of the first input signal as being the first to transition of the first and second input signals, and the action triggered by selection of the second input signal is recording of the second input signal as being the first to transition of the first and second input signals.

Optionally, the action is deemed completed after the action has been in progress for a time period that exceeds a threshold action period.

It will be appreciated that the asynchronous circuit of the digital sensor of the second aspect may include features set out in the first aspect and can incorporate other features as described herein.

According to a third aspect of the disclosure there is provided a method of operating an asynchronous circuit for requesting that an action is triggered, the method comprising 1) receiving a plurality of input signals, the input signals each having a first transition between states at a different time, 2) selecting one of the input signals based on the time of its first transition compared to the time of the first transition of the other input signals, 3) providing a request to an action block that is configured to: i) trigger the action in response to receiving the request, and ii) to provide an acknowledgement upon completion of the action, wherein: the request and the action are dependent on the input signal that was selected, 4) receiving the acknowledgement from the action block, and 5) initiating steps 1) to 4) for a second transition of the input signals after the plurality of input signals have undergone their first transitions.

Optionally, in step 3), the request is provided to the action block before any of the other input signals have undergone their first transitions.

Optionally, the action is deemed completed after the action has been in progress for a time period that exceeds a threshold action period.

It will be appreciated that the method of the third aspect may include providing and/or using features set out in the first aspect and can incorporate other features as described herein.

According to a fourth aspect of the disclosure there is provided a method of comparing a plurality of analog values using a digital sensor, the digital sensor comprising an asynchronous circuit for requesting that an action is triggered, the method comprising 1) receiving a plurality of input signals at the asynchronous circuit, the input signals each having a first transition between states at a different time, 2) selecting one of the input signals based on the time of its first transition compared to the time of the first transition of the other input signals using the asynchronous circuit, 3) providing from the asynchronous circuit a request to an action block that is configured to: i) trigger the action in response to receiving the request, and ii) to provide an acknowledgement upon completion of the action, wherein: the request and the action are dependent on the input signal that was selected, 4) receiving the acknowledgement from the action block at the asynchronous circuit, and 5) initiating steps 1) to 4) for a second transition of the input signals after the plurality of input signals have undergone their first transitions, wherein each input signal is received from a logic block, a digital go signal that exhibits a first transition between states is provided to the logic blocks, and the digital go signal is used to generate each of the input signals, such that each of the input signals corresponds to the digital go signal with a delayed first transition resulting from the logic block that outputs the input signal, and each of the logic blocks is configured to receive one of the analog values to be compared, the delayed first transition of the input signal provided by each logic blocks being dependent on the analog value received by that logic block, such that the delayed first transitions of the input signals are suitable for comparing each of the analog values.

Optionally, in step 3), the request is provided to the action block before any of the other input signals have undergone their first transitions.

Optionally, the action is deemed completed after the action has been in progress for a time period that exceeds a threshold action period.

It will be appreciated that the method of the fourth aspect may include providing and/or using features set out in the second aspect and can incorporate other features as described herein.

BRIEF DESCRIPTION OF THE DRAWINGS

The disclosure is described in further detail below by way of example and with reference to the accompanying drawings, in which:

FIG. 5A is a schematic of an asynchronous circuit in accordance with a first embodiment of the present disclosure, and FIG. 5B is a schematic of an asynchronous circuit in accordance with a second embodiment of the present disclosure;

DESCRIPTION

Figure 1:
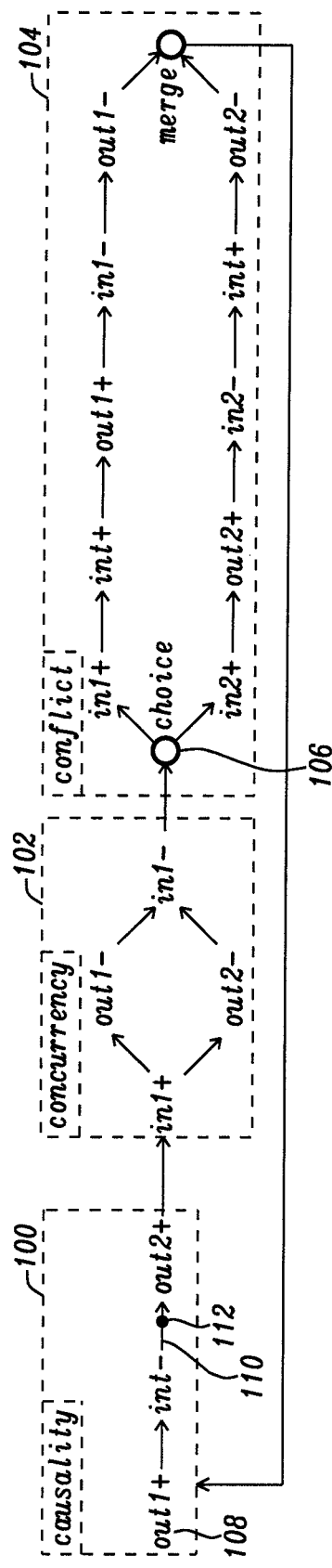
FIG. 1 is an example of a signal transition graph (STG)
Figure 2:
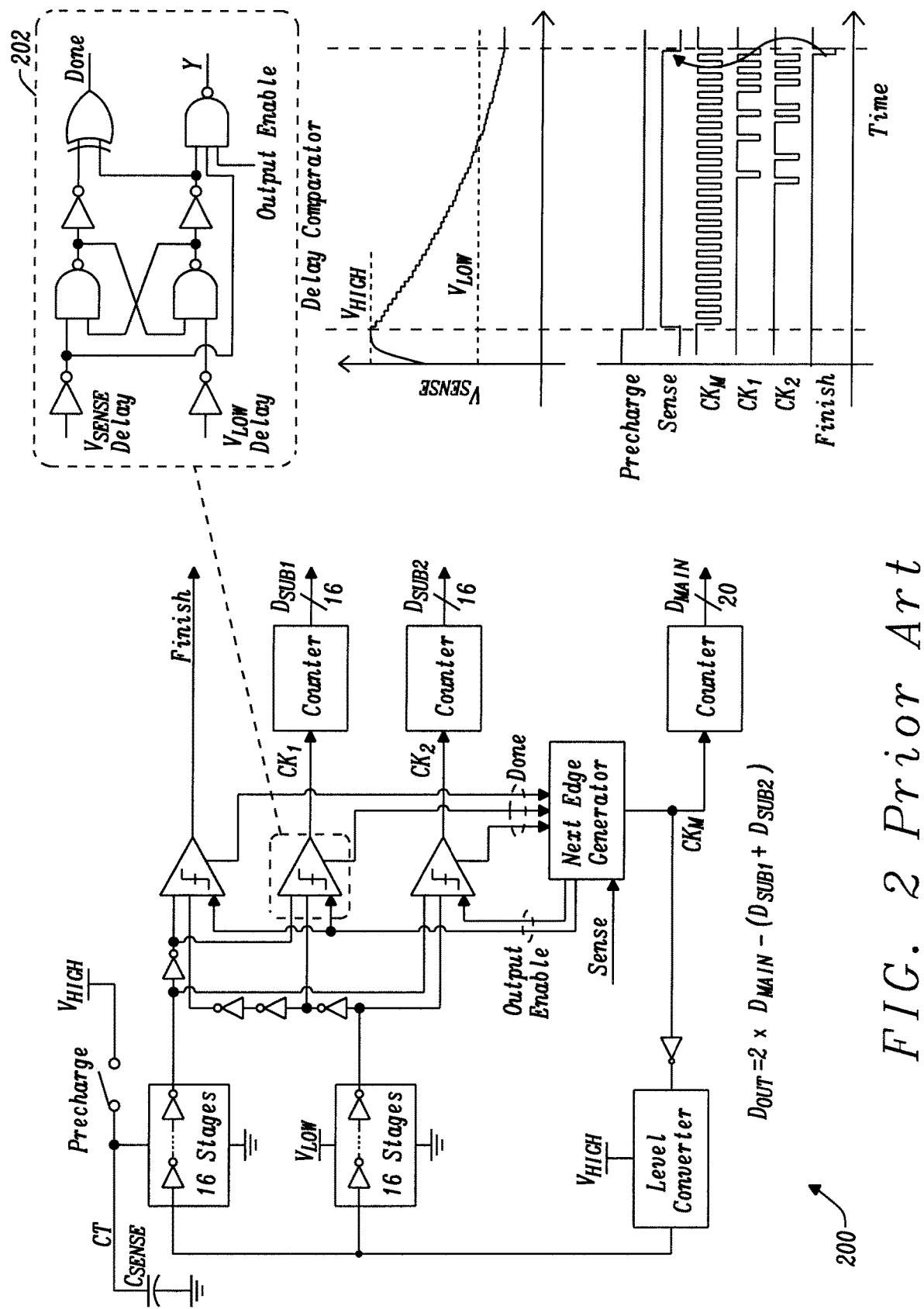
FIG. 2 is a schematic of a capacitance to digital converter using iterative delay change discharge and comprising a delay comparator in accordance with the prior art.
Figure 3:
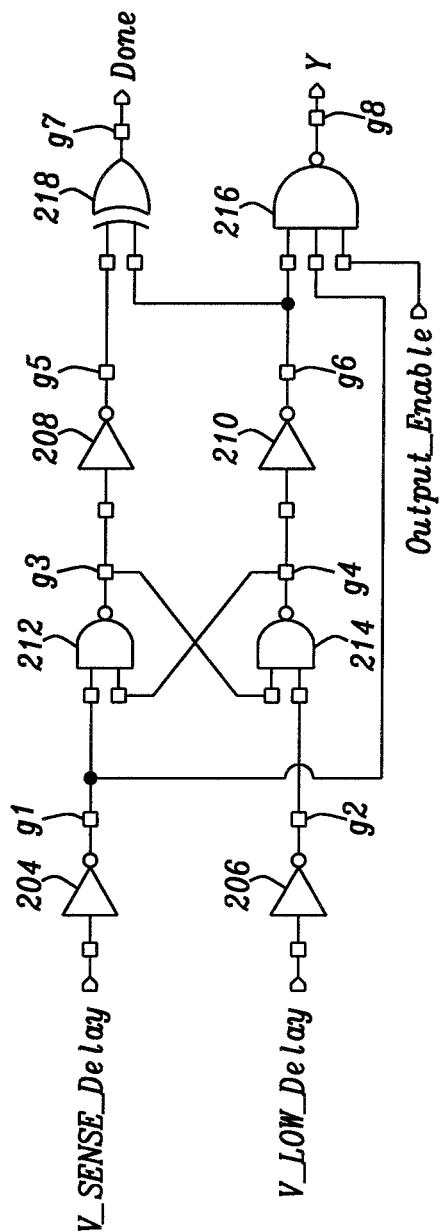
FIG. 3 is a schematic of the delay comparator of FIG. 2.
Figure 4C:
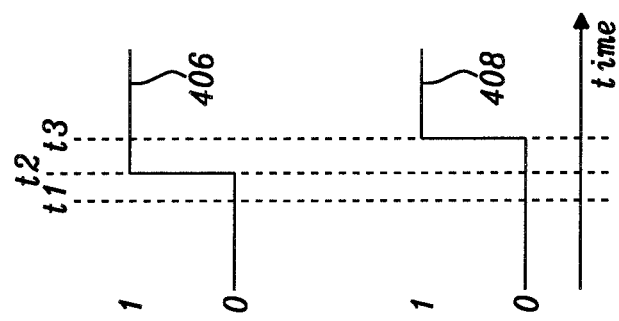
FIG. 4C is a timing diagram of output signals provided by the logic blocks of FIG. 4A.
Figure 4B:
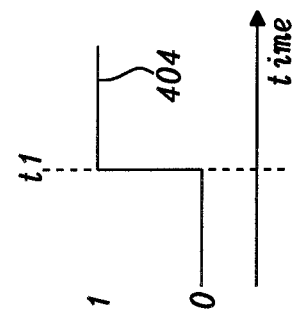
FIG. 4B is a timing diagram of an input signal received the logic blocks of FIG. 4A.
Figure 4A:
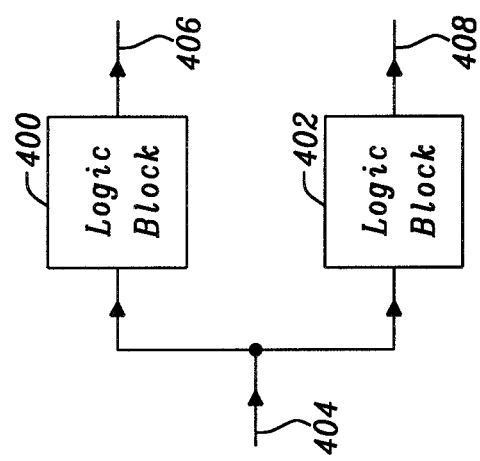
FIG. 4A is a schematic of two logic blocks.

FIG. 4A is a schematic of two logic blocks 400, 402 that each receive the same input signal 404. The logic block 400 outputs a delayed signal 406 and the logic block 402 outputs a delayed signal 408. FIG. 4B shows a timing diagram of the input signal 404 which is a digital signal that transitions from a low state (denoted by 0) to a high state (denoted by 1) at a time t1. The logic blocks 400, 402 may, for example, each comprise two inverters that are configured in accordance with the understanding of the skilled person.

FIG. 4C shows a timing diagram of the delayed signals 406, 408 where it can be seen that the delayed signals 406, 408 correspond to the input signal 404 each with an added delay. The delay is a time period between the transition of the input signal 404 at time t1, and the transition of the delayed signal 406, 408. The delayed signal 406 transitions from a low state to a high state at a time t2 and the delayed signal 408 transitions from a low state to a high state at a time t3, where time t3 occurs after time t2. Therefore, regarding the delayed signal 406, the delay is from time t1 to time t2, and regarding the delayed signal 408, the delay is from time t1 to time t3.

The unequal delays of the delayed signals 406, 408 results from each delayed signal's associated logic block, where a delayed signal's associated logic block is the logic block that output that delayed signal. For example, the logic block 400 is associated with the delayed signal 406. The unequal delays may result from physical differences between the individual logic blocks 400, 402 or may result from different external factors being applied to each of the logic blocks 400, 402. Physical differences affecting the delays may arise due to manufacturing variations.

Regarding external factors, each of the logic blocks 400, 402 may receive different voltages that can adjust their respective delays, thereby resulting in unequal delays. For example, a delay applied by a logic block implemented in a CMOS circuit, which may be referred to as its latency, is dependent on a supply voltage provided to the CMOS circuit. A basic example is a chain of inverters with a variable supply voltage. The lower the supply voltage, the slower the propagation of a signal through the chain of inverters, and the larger the delay. It will be appreciated by the skilled person that there are many other factors that can influence the delay applied by a logic block.

FIG. 5A is a schematic of an asynchronous circuit 500 for requesting that an action 510 is triggered, in accordance with a first embodiment of the present disclosure. The asynchronous circuit 500 is configured to receive a plurality of input signals 502, where each of the input signals 502 has a first transition between states at a different time. The asynchronous circuit 500 is configured to select one of the input signals based on the time of its first transition compared to the time of the first transition of the other input signals 502.

In operation, each of the plurality of input signals 502 undergoes a transition between states, for example as described for the delayed signals 406, 408 in FIG. 4C.

After selection of one of the input signals, a request 504 is provided to an action block 506 from the asynchronous circuit 500. The action block 506 is configured to trigger an action 510 in response to receiving the request 504 and to provide an acknowledgement 508 upon completion of the action 510. The request 504 and the action 510 are dependent on the input signal that was selected. The asynchronous circuit 500 is configured to receive the acknowledgement 508 from the action block 506.

The request 504 may be provided to the action block 506 before any of the other input signals 502 have undergone their first transitions.

The action 510 may be deemed completed after the action 510 has been in progress for a time period that exceeds a threshold action period.

Typically, each of the input signals 502 will be associated with a unique action, such that the action that is triggered will be dependent on the input signal that is selected, and different actions will be triggered for different selected input signals. In a further embodiment, two or more input signals may trigger the same action.

In the present embodiment only one input signal is selected, and one associated action is triggered. Further actions may only be triggered after all input signals 502 have undergone their first transitions, as is discussed in further detail below.

In a further embodiment two or more of the input signals may trigger their associated actions as they undergo transitions. For example, a first action may be triggered when a first input signal transitions and is selected, followed by a second action when a second input signal transitions.

An action block is a circuit or circuit component that performs an action, such as incrementing a counter, upon receiving a request. The action block also generates an acknowledgement signal when the action is complete. The action 510 is shown in the drawings as an arrow pointing outward from the action block 506. It will be appreciated that the action 510 may be carried out internally within the action block 506 and therefore the inclusion of the arrow is for illustrative purposes. For example, where an action block functions as a counter, the action is triggered within the action block to increment the number of counts recorded by the counter. Actions are represented similarly throughout the disclosure and it will be appreciated that in each case the actions may be carried out within their respective action blocks.

It will be appreciated that alternatively the action 510 may be the output of a signal from the action block 506 or may refer to multiple processes that are collectively referred to as the action 510. For example, the action 510 may refer to a sequence, in which the action block 510 outputs an output signal that is used to trigger the switching of a switch in a circuit that is external to the action block 510.

Initially, the plurality of input signals 502 undergo a first transition, which may be followed by subsequent transitions. The use of "first" to describe a transition is to denote relative ordering of transitions and is not intended to be limiting. For example, it is conceivable that the input signals 502 may undergo several transitions before the asynchronous circuit 500 begins the procedure of selecting an input signal and triggering an associated action. In such a case, the first transition may be defined as the transition that is first subject to the procedure of triggering an action associated with a selected input signal. However, this is also not intended to be limiting and the first transition may alternatively be any subsequent transition that is subject to the procedure of triggering an action associated with a selected input signal.

In the asynchronous circuit 500 an acknowledgement signal may be used for each action, to indicate the completion of that action.

The asynchronous circuit 500 is configured to initiate the steps of: receiving the plurality of input signals 502; selecting one of the input signals; providing a request 504 to the action block 506; and receiving the acknowledgement 508 from the action block 506, for a second transition of the input signals 502 after the input signals 502 have undergone their first transitions.

The steps that the asynchronous circuit 500 is configured to perform, namely, the steps of: receiving the plurality of input signals 502; selecting one of the input signals; providing a request 504 to the action block 506; and receiving the acknowledgement 508 from the action block 506, may be referred to collectively as "the racing process".

Initiating the racing process for the second transition of the input signals 502 enables the racing process to be repeated. It should be noted that initiating the steps of the racing process for the second transition of the input signals 502 is dependent on the input signals 502 having undergone their first transitions, without requiring the relevant action to have been completed. Therefore it is possible that the racing process will have been initiated for the second transition whilst the action associated with the racing process of the first transition is still in progress, and before the acknowledgement signal resulting from the completion of that action has been received by the asynchronous circuit 500.

It will be appreciated that the second transition may not be the transition that immediately follows the first transition. For example, the first transition may be a rising edge and the second transition may be the next rising edge. As such, in this example, there is a falling edge transition between the first and second transitions which is not subject to the racing process.

Waiting for all input signals to have undergone their first transition before restarting the racing process for their second transitions ensures that the racing process can be repeated. It will be appreciated that in a further embodiment the racing process may be restarted before all input signals have undergone their first transitions.

Each iteration of the racing process may trigger one action associated with the selection of only one input signal. In further embodiments multiple actions may be triggered with each iteration of the racing process, where each triggered action is associated with the transitioning of a different input signal, as discussed previously.

Upon initiating the step of providing the request 504 to the action block 506 for the second transition of the input signals, if a different action is to be triggered from a previously triggered action and the acknowledgement indicating that the previously triggered action has completed has not been received, the different action is triggered while the previously triggered action is in progress. This enables actions to be carried out in parallel if two different actions are selected, and the initial action is still not completed.

If a same action is to be triggered as the previously triggered action and the acknowledgement indicating that the previously triggered action has completed has not been received, the action is repeated upon completion of the previously triggered action. This ensures that problems do not arise by trying to trigger an action a second time whilst the first occurrence of the action is still in progress, or by missing the triggering of an action. In summary, the acknowledgement signal 508 is necessary to ensure that an action has completed before it is retriggered.

Inclusion of acknowledgement signals 508 ensures that the racing process can be repeated in quick succession and without having to introduce a delay before starting the next iteration of the process to ensure that the previous action has completed. Therefore, it will be appreciated that in a further embodiment providing and receiving of acknowledgement signals 508 may be omitted at the expense of these benefits.

It will be appreciated that the asynchronous circuit 500 may receive further input signals that are not processed in the way as described above for the input signals 502. As such the plurality of input signals 502 may correspond to a subset of the total input signals received by the asynchronous circuit 500.

As the request 504 may be provided to the action block 506 before any of the other input signals 502 have undergone their first transitions, the asynchronous circuit 500 is suitable for treating input signals 502 independently. For example, an action can be triggered by the asynchronous circuit 500 without having to wait for all input signals 502 to undergo a transition. This is in contrast to the delay comparator 202 which can only provide an output when all of its input signals have transitioned. It will be appreciated that in a further embodiment of the present disclosure the request 504 may not be provided to the action block 506 until two or more input signals 502 have undergone their first transitions, and in such an embodiment the asynchronous circuit may be less suitable for treating the input signals 502 independently.

FIG. 5B is a schematic of an asynchronous circuit 512 in accordance with a second embodiment of the present disclosure. The plurality of input signals received by the asynchronous circuit 512 are the delayed signals 406, 408 as shown in FIG. 4C. FIG. 5B shares features with FIG. 5A and therefore common features between figures share common reference numerals and variables.

The selected input signal may be the first transitioning input signal, which can typically be defined as the input signal that has a first transition before the other input signals. A case where the first transitioning input signal may be otherwise defined is discussed below.

In the present example, the first transitioning input signal may be identified as the delayed signal 406, because the delayed signal 406 has a first transition before the delayed signal 408. This results in the request 504 and action 510 being dependent on the delayed signal 406. After the delayed signal 408 transitions, the racing process may be repeated as discussed previously.

Figure 6:
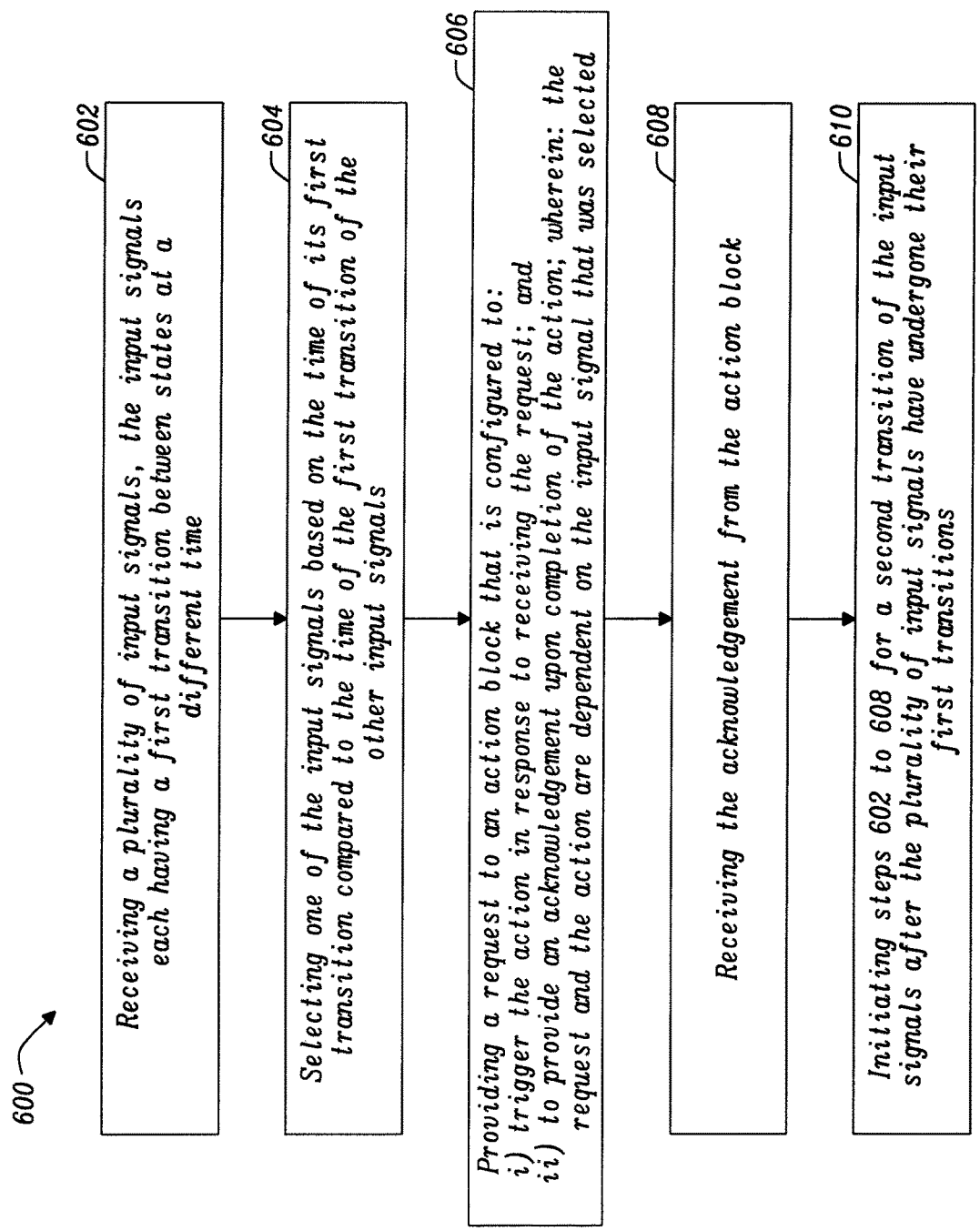
FIG. 6 is a flow chart showing a method of operating the asynchronous circuits of FIG. 5A and FIG. 5B.

FIG. 6 is a flow chart showing a method 600 of operating the asynchronous circuit 500, 512 for requesting that an action is triggered. The method 600 comprises receiving a plurality of input signals, the input signals each having a first transition between states at a different time at a step 602; selecting one of the input signals based on the time of its first transition compared to the time of the first transition of the other input signals, at a step 604; providing a request to an action block that is configured to trigger the action in response to receiving the request and to provide an acknowledgement upon completion of the action, in which the request and the action are dependent on the input signal that was selected, at a step 606; receiving the acknowledgement from the action block at a step 608; and initiating the steps 602 to 608 for a second transition of the input signals after the plurality of input signals have undergone their first transitions, at a step 610.

Figure 7:
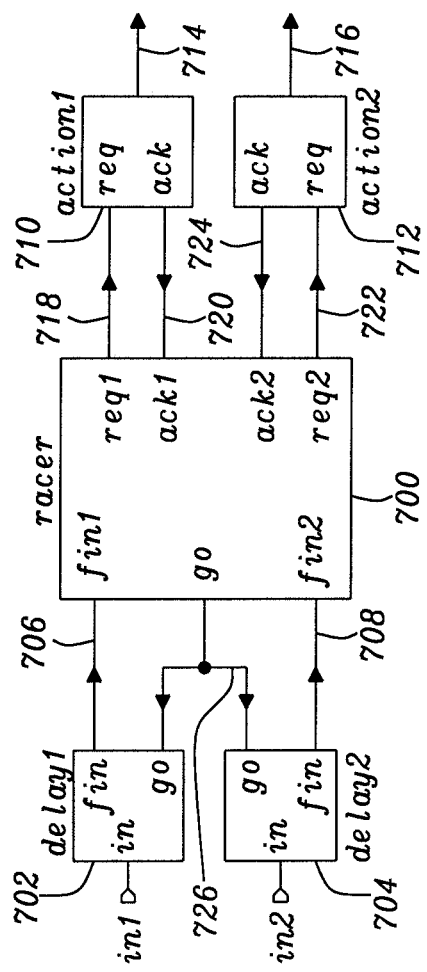
FIG. 7 is a schematic of an asynchronous circuit in accordance with a third embodiment of the present disclosure.

FIG. 7 is a schematic of an asynchronous circuit 700, in accordance with a third embodiment of the present disclosure. The asynchronous circuit 700 is coupled to a logic block 702 and a logic block 704. The asynchronous circuit 700 receives an input signal 706 (also denoted by fin1) from the logic block 702 and receives an input signal 708 (also denoted by fin2) from the logic block 704. The asynchronous circuit 700 is coupled to an action block 710 that is associated with the logic block 702 and the input signal 706; the asynchronous circuit 700 is also coupled to an action block 712 that is associated with the logic block 704 and the input signal 708. If the input signal 706 is selected an action 714 is triggered and if the input signal 708 is selected an action 716 is triggered. As discussed previously, the actions 714 and 716 may be implemented within the action blocks 710 and 712, respectively.

In the present example, the selected input signal is the first transitioning input signal.

The asynchronous circuit 700 operates substantially as described for the asynchronous circuits 500, 512 and the method described by the flow chart 600. In FIG. 7, compared to FIGS. 5A and 5B, there is shown distinct action blocks 710, 712 and actions 714, 716 associated with each of the input signals 706, 708. This is for illustrative purposes to highlight that there is a different action associated with each of the input signals and to simplify the following description. It will be appreciated that a single action block would be sufficient to serve the purpose to receive and acknowledge different requests, and to trigger the different actions.

In the present example, the asynchronous circuit 700 receives two input signals. Although the present embodiment relates to two input signals, this is not intended to be limiting and it will be clear to the skilled person how in a further embodiment the asynchronous circuit 700 may be modified to support more than two input signals. For example, the asynchronous circuit may be coupled with more than two logic blocks and more than two action blocks to support more than two input signals.

In operation, if the input signal 706 transitions before the input signal 708, a request 718 (also denoted by req1) is sent to the action block 710. In response, the action 714 is triggered and an acknowledgement 720 (also denoted by ack1) is sent to the asynchronous circuit 700 upon completion of the action 714. Once the input signal 708 transitions, the racing process may be repeated to identify a next first transitioning input signal.

In operation, if the input signal 708 transitions before the input signal 706, a request 722 (also denoted by req2) is sent to the action block 712. In response, the action 716 is triggered and an acknowledgement 724 (also denoted by ack2) is sent to the asynchronous circuit 700 upon completion of the action 716. Once the input signal 706 transitions, the racing process may be repeated to identify a next first transitioning input signal.

A digital go signal 726 (also denoted by go) that exhibits a first transition between states is provided to the logic blocks 702, 704. The asynchronous circuit 700 may provide the digital go signal 726. The digital go signal 726 may be asynchronously generated.

The digital go signal 726 may be used to start the racing process by generating each of the input signals 706, 708, such that each of the input signals 706, 708 corresponds to the digital go signal 726 with a delayed first transition resulting from the logic block 702, 704 that outputs the input signal.

Operation of the logic blocks 702, 704 is as substantially described for the logic blocks 400, 402 shown in FIG. 4A, where the digital go signal 726 corresponds to the input signal 404 and the input signals 706, 708 correspond to the delayed signals 406, 408.

As described previously, the delay applied by logic blocks may be affected by a number of factors, for example manufacturing variations or voltages used to adjust the delays. These factors are represented in FIG. 7 by signal in1 for logic block 702 and signal in2 for logic block 704. The signals in1, in2 may be analog signals. It will be appreciated that the factor that affects the delay may not be provided by a signal, for example when it is a result of manufacturing variations, and in such a case, the inclusion of signals in1, in2 are for illustrative purposes.

The digital go signal 726 may exhibit a second transition after all input signals 706, 708 have undergone their first transitions, thereby providing second transitions of the plurality of input signals 706, 708 for repeating of the racing process. The input signals 706, 708 will each exhibit second transitions from which the next first input signal transition may be identified, and the appropriate action triggered.

The digital go signal 726 may exhibit further transitions to enable repetition of the racing process one or more times. The racing process may be repeated one or more times where the first transitioning signal is identified each time.

As discussed previously, FIG. 7 has been shown for two logic blocks 702, 704 and two input signals 706, 708 however it will be appreciated that the asynchronous circuit 700 may be applied to any number of logic blocks, input signals and actions in accordance with the understanding of the skilled person.

The asynchronous circuit 700 may be referred to as a "racer" as the input signals 706, 708 are "raced" with the winner of the input signals 706, 708 (the winner being the input signal having the earliest transition) being used to determine which of the two actions 714, 716 is triggered. The loser may be defined as the input signal 706, 708 that does not have the earliest transition. It will be appreciated than in embodiments having more than two input signals there will be more than one loser. The race begins with the input signals 706, 708 being received by the asynchronous circuit 700. The race may be carried out repeatedly, with the next race being started after all losers have been waited for, which corresponds to all remaining input signals having transitioned. The next race may proceed concurrently with the action triggered in the previous race. The digital go signal 726 is used to start the race, and restart the race with each repetition. The race may be repeated a fixed multiple of times or until some condition is met. In summary, the racer determines the winner and triggers the associated action, waits for losers and restarts the race.

Each race may result in the triggering of a single action that is associated with the selected input signal (the winner), with no actions being triggered for input signals that are not selected (the losers). Alternatively, in further embodiments, within each race multiple actions may be triggered as multiple input signals transition, as discussed previously.

Figure 8:
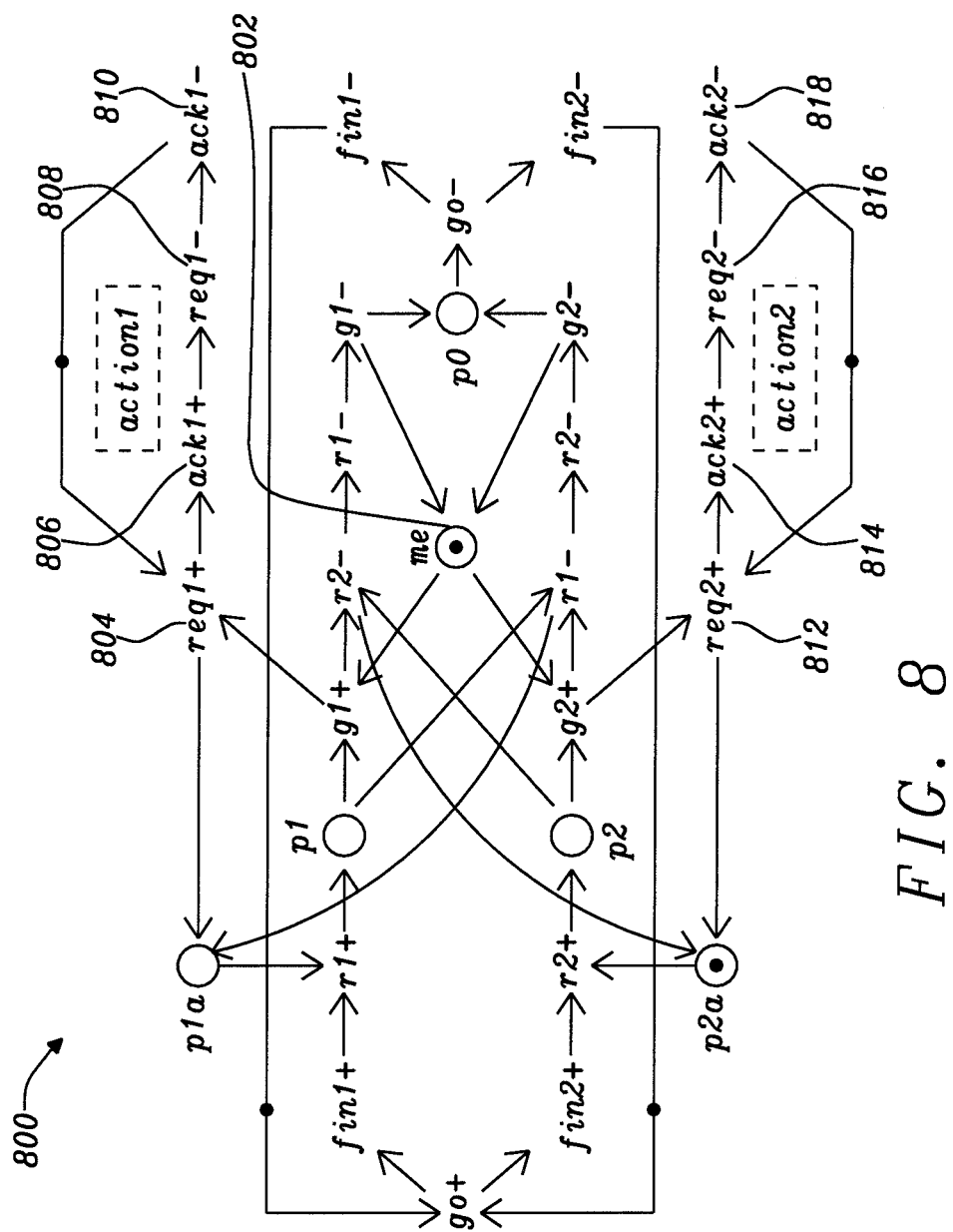
FIG. 8 is an STG specification of the asynchronous circuit of FIG. 7.

FIG. 8 is an STG specification 800 of the asynchronous circuit 700. The STG specification 800 captures the high-level behaviour of the asynchronous circuit 700 using the notation introduced previously for the asynchronous circuit 700 and in accordance with the skilled person's understanding of STG diagrams and the use of conventional STG notation.

In an initial state go+ output is enabled and its firing starts the race. The asynchronous circuit 700 selects the winner by identifying the first of fin1+ and fin2+ inputs. The fin1+ and fin2+ inputs may arrive close to each other and therefore require arbitration. This is modelled by place me 802 which is an arbitrating choice. In a physical circuit, place me 802 may be implemented using a mutex (discussed below). Additionally, the loser of fin1+, fin2− may bypass the mutex in a physical implementation of the asynchronous circuit 700 to improve efficiency. The mutex may also be referred to as a mutex element.

Internal signals g1, g2 model mutex grants and internal signals r1, r2 model mutex requests. These signals follow the mutex protocol (this has been formally verified), and therefore this arbitration can be implemented by a mutex with requests {r1, r2} and the grants {g1, g2}.

"Mutex" is short for mutual exclusion element. This is a special asynchronous circuit designed to safely decide the order in which two input signals change. A mutex is a type of asynchronous arbiter, as described previously. In particular, the mutex is a two-way arbiter.

A mutex has two request inputs r1 and r2 and two grant outputs g1 and g2. If two requests occur at the same time or within a defined metastability time window of each other, there can be a metastable event. The mutex is designed to contain this metastable event within its own logic, keeping both outputs g1, g2 low until such time as the metastability is resolved. Then, the appropriate grant is issued as an output.

A mutex may operate as follows: if r1 rises before r2 rises, then g1 rises and g2 is held low. If r2 rises before r1 rises, then g2 rises and g1 is held low. If r1 and r2 rise at the same time, then the circuit will randomly select either g1 or g2.

Note that there is no race on the reset phase triggered by the go– output and therefore there is no need to determine a winner between fin1– and fin2–. However, it will be appreciated that in further embodiments it may be desirable to also identify the winner between fin1– and fin2–.

A request-acknowledgement handshake is an interface comprising a request signal req and an acknowledgement signal ack of opposite direction (one is an input and the other is an output) whose switching follows the protocol: req+ →ack+→req–→ack–. The request-acknowledgement handshake is provided by the request signals, the acknowledgement signals and the action blocks (for example request signal 718, acknowledgement signal 720 and action block 710) as described previously. The request-acknowledgement handshake is an example of a means of implementing steps 606 and 608 of the method 600 in the asynchronous circuit 700.

In summary, the request-acknowledgement handshake is a means of coordinating activity between the asynchronous circuit 700 and an external component. In the present example, the external components are the action blocks 710, 712.

A rising edge of the request 804 (req1+), corresponding to a rising edge of the request 718, starts the action 714. After the action 714 is complete, a rising edge of the acknowledgement 806, corresponding to a rising edge of the acknowledgement 720 is provided to the asynchronous circuit 700. A falling edge of the request 808 (reg1–), corresponding to a falling edge of the request 718, is used to return the request 718 to a low state in preparation for the next iteration of the racing process. A falling edge of the acknowledgement 810 (ack1–), corresponding to a falling edge of the acknowledgement 720, is used to return the acknowledgement 720 to a low state in preparation for the next iteration of the racing process.

Note that the request-acknowledgement handshake may proceed in a different way, in accordance with the understanding of the skilled person. For example, a falling edge of the request 718 may be used to trigger the action 714, rather than the rising edge.

Triggering of the action 716 will be clear to the skilled person, based on the description of the triggering of the action 714. Shown on the STG specification 800 are a rising edge of the request 812 (req2+), corresponding to a rising edge of the request 722, a rising edge of the acknowledgement 814 (ack2+), corresponding to a rising edge of the acknowledgement 724, a falling edge of the request 816 (req2–), corresponding to a falling edge of the request 722, and a falling edge of the acknowledgement 818 (ack2–), corresponding to a falling edge of the acknowledgement 724.

As discussed previously, the first transitioning input signal is typically defined as the input signal that transitions between states before the other input signals. However, two or more input signals may transition at approximately the same time or with a difference in time that is indistinguishable using a practical implementation of the asynchronous circuit 700. This was as described in the STG specification 800 where the fin1+ and fin2+ inputs arrive close to each other and therefore require arbitration, which is achieved using a mutex.

In specific terms, the first transitioning input signal, may be defined as being either the input signal that has a first transition between states in a time period that exceeds a threshold delay period before the other input signals undergo their first transitions, or the input signal arbitrarily selected from two or more input signals that have first transitions between states before the other input signals, where the time period between the first transitions of the two or more input signals is less that the threshold delay period.

When the time period between transitions of two or more input signals is less than the threshold delay period, the first transitioning input signal is chosen from the two or more input signals by the mutex. As it is only necessary to use the mutex when the transitions of two or more input signals occur at a time that may be considered approximately equal for practical purposes, the mutex may randomly select one of the input signals to be the first transitioning signal, without adversely impacting the overall operation of the asynchronous circuit 700.

Figure 9A:
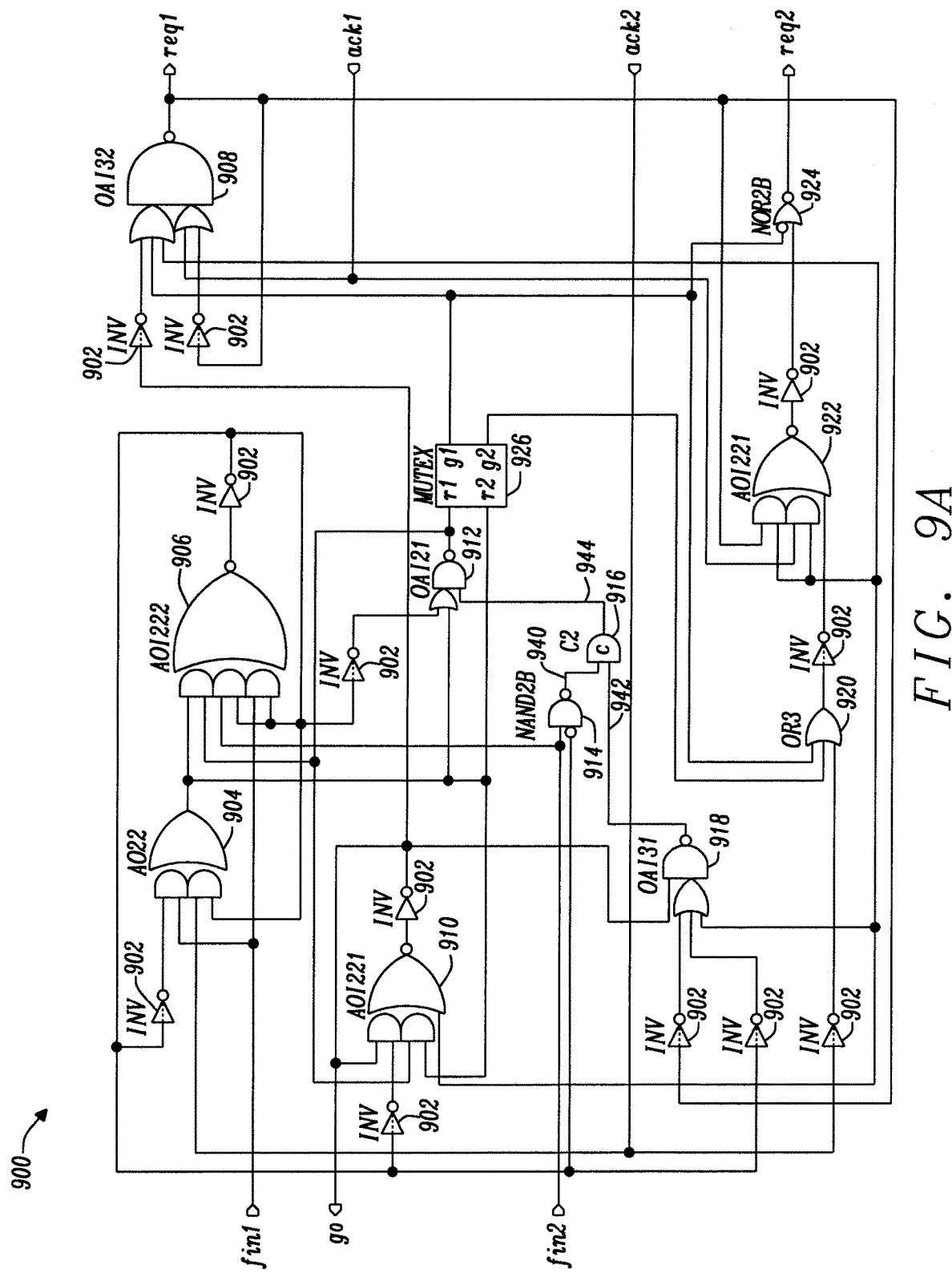
FIG. 9A is a schematic circuit diagram of an asynchronous circuit showing a potential implementation of the asynchronous circuit of FIG. 7 in accordance with a fourth embodiment of the present disclosure.

FIG. 9A is a schematic circuit diagram of an asynchronous circuit 900 showing a potential physical implementation of the asynchronous circuit 700 and the STG specification 800, and in accordance with a fourth embodiment of the present disclosure.

The asynchronous circuit 900 comprises inverters 902, an AO22 gate 904, an AOI222 gate 906, an OAI32 gate 908, an AOI221 gate 910, an OAI21 gate 912, a NAND2B gate 914, c-element 916, an OAI31 gate 918, an OR3 gate 920, an AO1221 gate 922, a NOR2B gate 924, and a mutex element 926.

The notation used for the logic gates shown in the asynchronous circuit 900 is used to denote two-level logic gates and will be well understood by the skilled person. "A" denotes an AND gate, "0" denotes an OR gate and "I" denotes that the output is inverted. The sequence of letters denotes the order of gates, where the gate or gates corresponding to the first letter receives the input signals, which are then passed to the gate corresponding to the second letter in the sequence. If the final letter of the sequence is "I" then the output is inverted. The number of numbers denotes how many inputs the gate corresponding to the second letter in the sequence has. Each individual numeral represents the number of inputs a single gate has. For example, for AOI221, there are two AND gates each having two inputs and providing outputs to an OR gate. The OR gate has three inputs and provides an inverter output.

For gate inputs A, B, C, D, E, F, the Boolean functions describing output signals provided by each of the gates are as follows: the AO22 gate 902, A AND B OR C AND D; the AOI222 gate 906, NOT (A AND B OR C AND D OR E AND F); the OAI32 gate 908, NOT ((A OR B OR C) AND (D OR E)); the AOI221 gate 910, NOT (A AND B OR C AND D OR E); the NAND2B gate 914, NOT (NOT A AND B); the OAI31 gate 918 NOT ((A OR B OR C) AND D); the OR3 gate 920, A OR B OR C; the NOR2B gate 924, NOT (NOT A OR B).

Figure 9B:
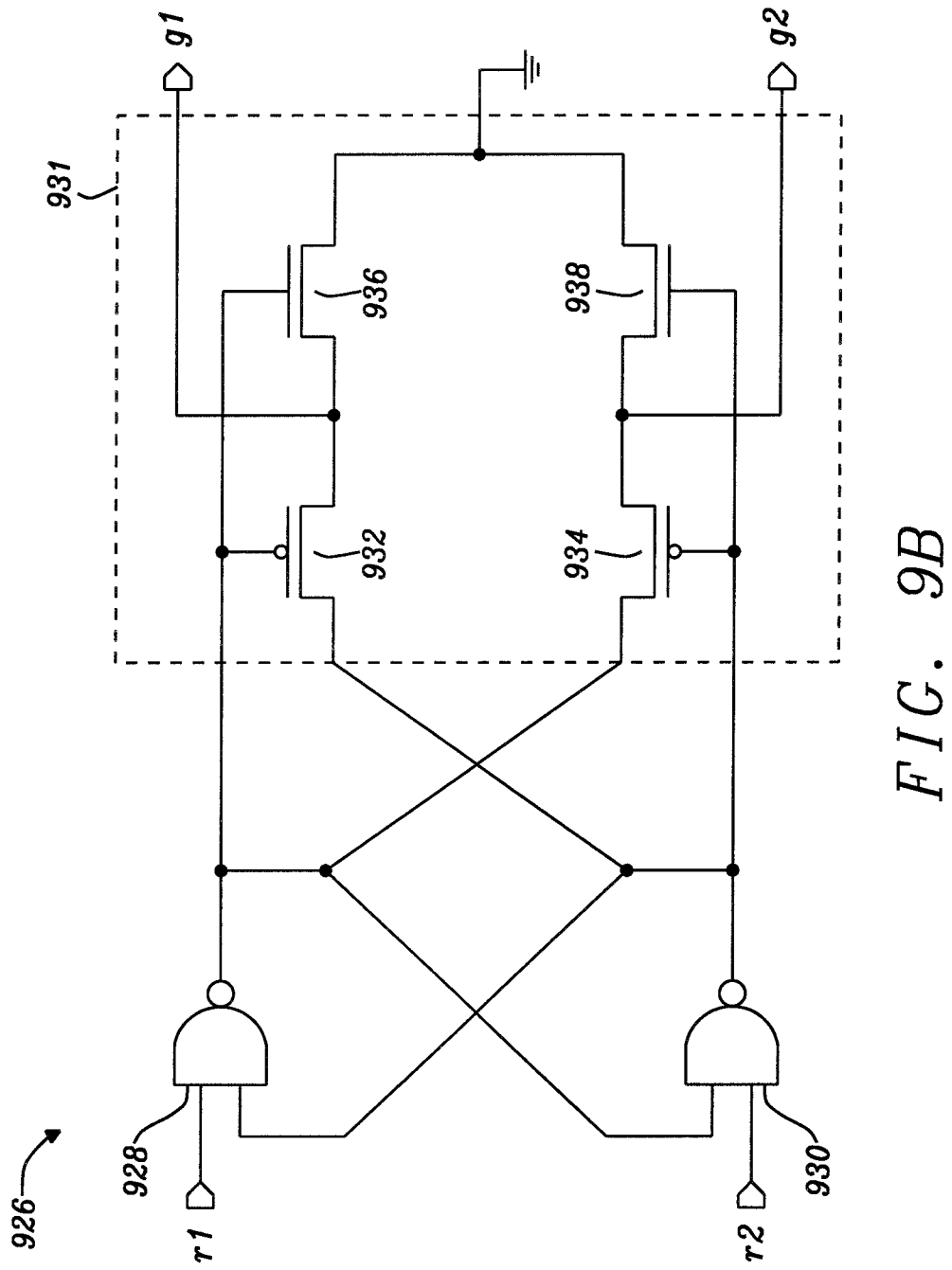
FIG. 9B is a schematic of a potential implementation of a mutex element.

FIG. 9B is a schematic of a potential implementation of the mutex element 926. The mutex elements 926 receives requests r1, r2 and provides grants g1, g2 as discussed previously. The mutex element 926 comprises two AND gates with inverted outputs 928, 930, and a metastability filter 931 comprising four transistors 932, 934, 936, 938.

The mutex element 926 is configured to arbitrarily select the first transitioning input signal from the two input signals fin1, fin2, where the time period between the first transitions of the two input signals fin1, fin2 is less that the threshold delay period.

In a further embodiment, the mutex element 926 may be configured to arbitrarily select the first transitioning input signal from two or more input signals that have first transitions between states before the other input signals, where the time period between the first transitions of the two or more input signals is less that the threshold delay period.

After selection of the first transitioning input signal, the other input signals may not be provided to the mutex element 926.

Figure 9C:
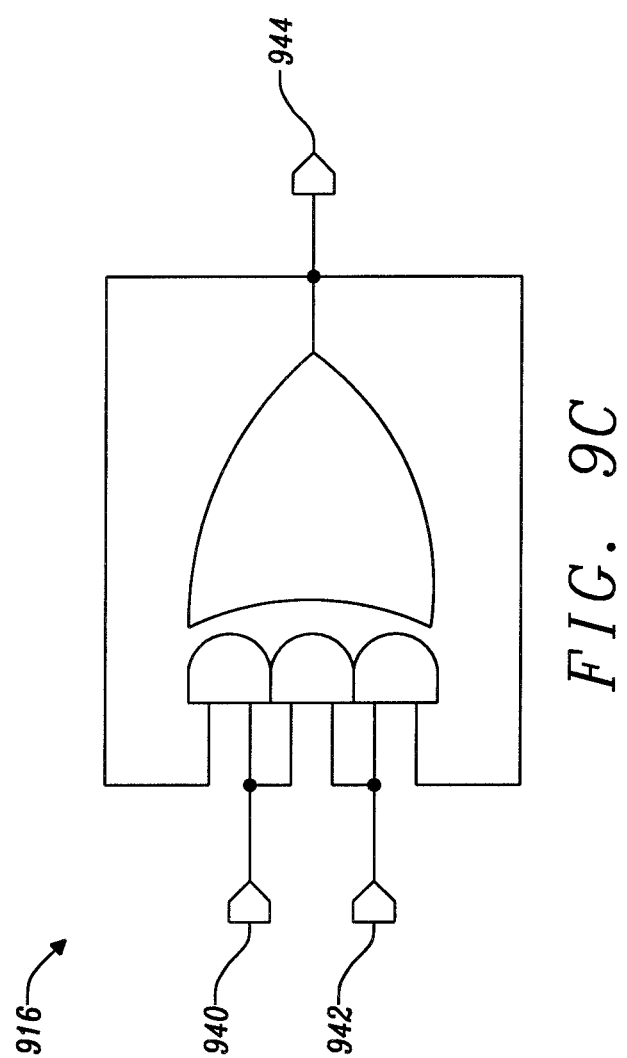
FIG. 9C is a schematic of a potential implementation of a c-element.

FIG. 9C is a schematic of a potential implementation of the c-element 916. The c-element receives inputs 940, 942 and provides an output 944.

The asynchronous circuit 700 may be used to perform repeated comparisons of two or more delays which may vary with each repetition. Potential applications include a digital sensor for measuring an analog value such as a voltage, a capacitance, or a temperature, or for comparing voltage, capacitance or temperature values.

Figure 10:
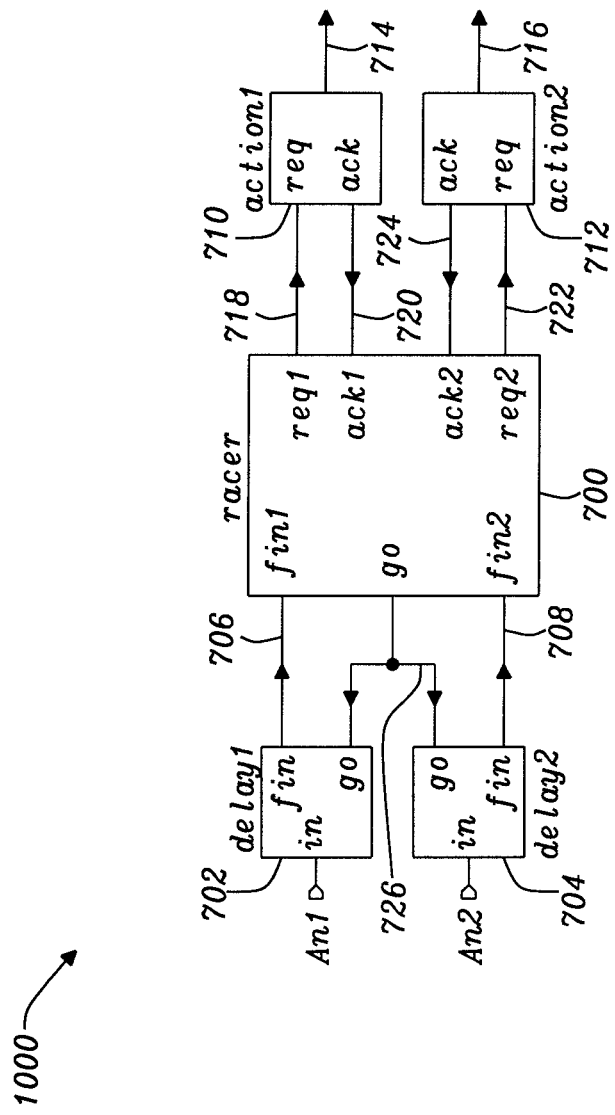
FIG. 10 is a schematic of a digital sensor in accordance with a fifth embodiment of the present disclosure.

FIG. 10 is a schematic of a digital sensor 1000 for comparing a plurality of analog values in accordance with a fifth embodiment of the present disclosure. In the present example, the plurality of analog values comprises an analog value An1 and an analog value An2, however it will be appreciated that in a further embodiment more than two analog values may be compared, in accordance with the understanding of the skilled person.

The digital sensor 1000 comprises the asynchronous circuit 700 for requesting that an action is triggered. The asynchronous circuit 700 is configured to perform the steps as outlined previously and described in the method 600. The signals in1 and in2 as shown in FIG. 7 correspond to the analog values An1 and An2, respectively, in the present example of the digital sensor 1000.

The asynchronous circuit 700 is configured to receive a plurality of input signals 706, 708. Each input signal is received from a logic block, and in this particular example, the input signal 706 is received from the logic block 702 and the input signal 708 is received from the logic block 704. The digital go signal 726 that exhibits a first transition between states, and is as described previously, is provided to the logic blocks 702, 704.

The digital go signal 726 is used to generate each of the input signals 706, 708, such that each of the input signals 706, 708 corresponds to the digital go signal 726 with a delayed first transition resulting from the logic block that outputs the input signal.

Each of the logic blocks 702, 704 is configured to receive one of the analog values An1, An2 to be compared. The delayed first transition of the input signal provided by each logic block is dependent on the analog value received by that logic block, and therefore the delayed first transitions of the input signals 706, 708 are suitable for comparing each of the analog values An1, An2.

It will be appreciated by the skilled person that in a further embodiment there may be more than two analog values compared by increasing the number of logic blocks providing input signals to the asynchronous circuit 700.

In the present embodiment of the digital sensor 1000, the asynchronous circuit 700 is configured to initiate the steps of: receiving the plurality of input signals 706, 708; selecting one of the input signals; providing a request (718 or 722) to the action block (710 or 712); and receiving the acknowledgement (720 or 724) from the action block (710 or 712) for a second transition of the input signals after the plurality of input signals have undergone their first transitions.

As discussed previously, the analog values may comprise at least one of: voltages, capacitances and temperatures. In effect, the digital sensor 1000 may be used to measure analog values, such as voltage, capacitance and temperature, by converting the analog values into a delay on signals received by the asynchronous circuit 700.

The request (718 or 722) may be provided to the action block (710 or 712) before any of the other input signals have undergone their first transitions.

Figure 11:
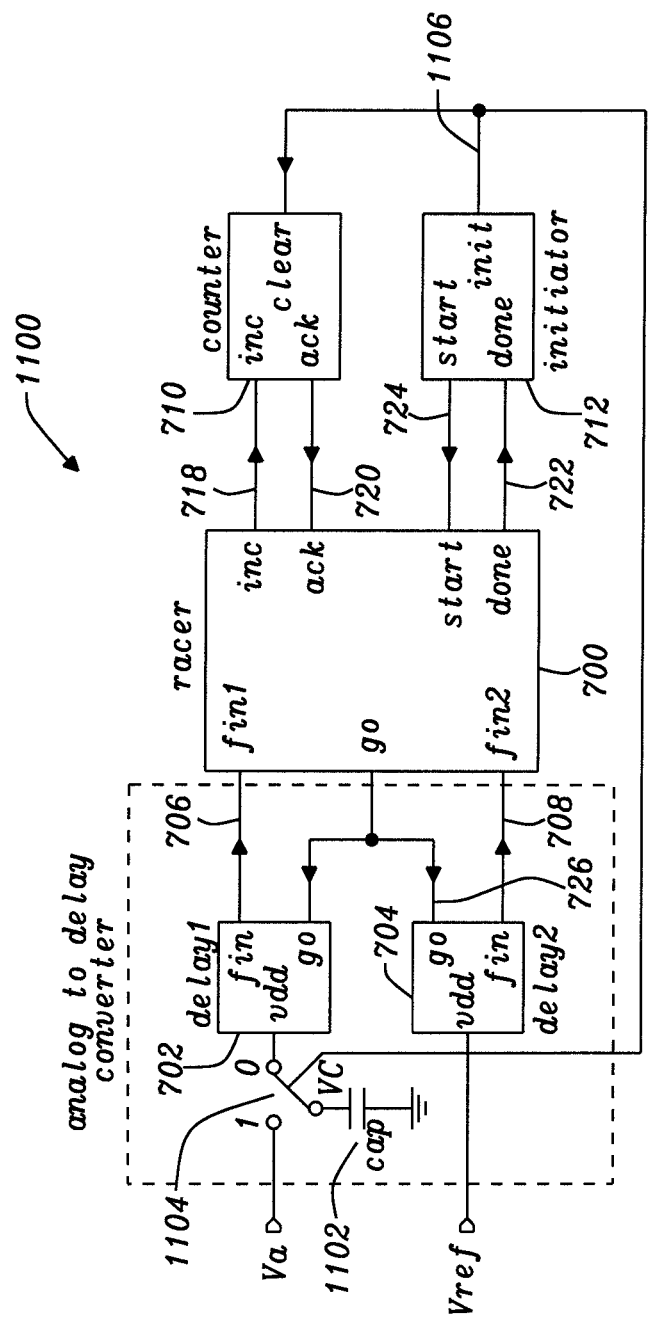
FIG. 11 is a schematic of a digital sensor in accordance with a sixth embodiment of the present disclosure.

FIG. 11 is a schematic of a digital sensor 1100 in accordance with a sixth embodiment of the present disclosure. The digital sensor 1100 is a specific embodiment of the digital sensor 1000 configured to function as a voltage sensor by comparing a first voltage Va to be sensed with a reference voltage Vref. As such the analog values compared by the digital sensor 1100 comprise the voltages Va, Vref. Preferably, the reference voltage Vref is a stable reference voltage. The digital sensor 1100 shares features with the digital sensor 1000 and therefore common features between figures share common reference numerals and variables.

The plurality of input signals comprises the input signal 706 and the input signal 708. The input signal 706 is received from the logic block 702 and the input signal 706 is received from the logic block 704.

Prior to operation, a capacitor 1102 is charged by the first voltage Va for a fixed duration such that the capacitor 1102 accumulates a charge and has a capacitor voltage VC that is proportional to the first voltage Va.

In operation, the capacitor 1102 is then switched to couple with the logic block 702, such that the delayed first transition of the input signal 706 provided by the logic block 702 is dependent on the capacitor voltage VC. The logic block 704 is coupled to the reference voltage Vref such that the delayed first transition of the input signal 708 provided by the logic block 704 is dependent on the reference voltage Vref.

The capacitor voltage VC may be provided to the logic block 702 as its supply voltage, and the reference voltage Vref may be provided to the logic block 704 as its supply voltage.

The action triggered by selection of the input signal 706 is the incrementation of a counter and the partial discharge of the capacitor 1102. As such, the action block 710 in the present example functions as the counter with the action 714 being the incrementation of the counter and the partial discharge of the capacitor 1102. The action 714 is not shown in FIG. 11 as it is implemented internally within the action block 710.

The asynchronous circuit is 700 configured to initiate the steps of: receiving the plurality of input signals 706, 708; selecting one of the input signals; providing a request (718 or 722) to the action block (710 or 712); and receiving the acknowledgement (720 or 724) from the action block (710 or 712), for one or more later transitions of each of the input signals after the plurality of input signals have undergone their first transitions. The action triggered by selection of the input signal 708 is to not repeat the racing process. The number of increments recorded by the counter is suitable for measuring the first voltage Va.

In this specific embodiment, the selected input signal is the first transitioning input signal. Initially, the input signal 706 will be identified as the first transitioning input signal as the first voltage Va exceeds the reference voltage Vref, such that the input signal 706 will have a shorter delay than that of the input signal 708. However as the capacitor voltage VC is depleted with each iteration, the delay of the input signal 706 will progressively increase until the input signal 708 is identified as the first transitioning input signal. At this point it is possible to measure the first voltage Va with reference to the value of increments recorded by the counter.

In operation, when the input signal 706 is selected, the request 718 (denoted in this example by "inc") is provided to the action block 710. In response, the action 714 (implemented within the action block 710) is triggered to increment the counter and to partially discharge the capacitor 1102. After the counter has been incremented and the capacitor 1102 has been partially discharged the acknowledgement 720 (ack) is sent to the asynchronous circuit 700. Once the input signal 708 transitions, the racing process is repeated by a further transition of the digital go signal 726 to identify a next first transitioning input signal.

Eventually, the input signal 708 will be identified as the first transitioning input signal and the request 722 (denoted in this example by "done") is provided to the action block 712 to halt the repetition of the racing process. The request 722 is only provided after the acknowledgement 720 has been received from the previous iteration, indicating that the incrementation of the counter and partial discharge of the capacitor 1102 has been completed. At this point it is possible to measure the first voltage Va with reference to the value of increments recorded by the counter. The value of the counter is monotonous (logarithmic) on the first voltage Va.

The action block 712 may start or restart the racing process for measuring the first voltage Va by resetting the counter, where the action 716 (not shown) is the application of an initiation signal 1106 (provided from "init" in the action block 712) to the counter (received at "clear" in the action block 710) to reset the counter. It should be noted that the action 716 may not be immediately triggered after selection of the input signal 708 as the first transitioning input signal, but may alternatively be user controlled based on the user having recorded the number of increments recorded by the counter and wanting to measure the first voltage Va again. The action 716 also comprises the use of the initiation signal 1106 to control a switch 1104 for selectively coupling the capacitor 1102 to the first voltage Va or the logic block 702. Therefore, during this reset procedure, the action block 712 (which may be referred to as an initiator in the present embodiment) produces the initiation signal 1106. The initiation signal 1106 comprises a sufficiently long pulse to clear the counter 710 and to charge the capacitor 1102 to a sufficiently high level. The acknowledgement 724 may be used to alert the asynchronous circuit 700 to start/restart the racing process.

Figure 12:
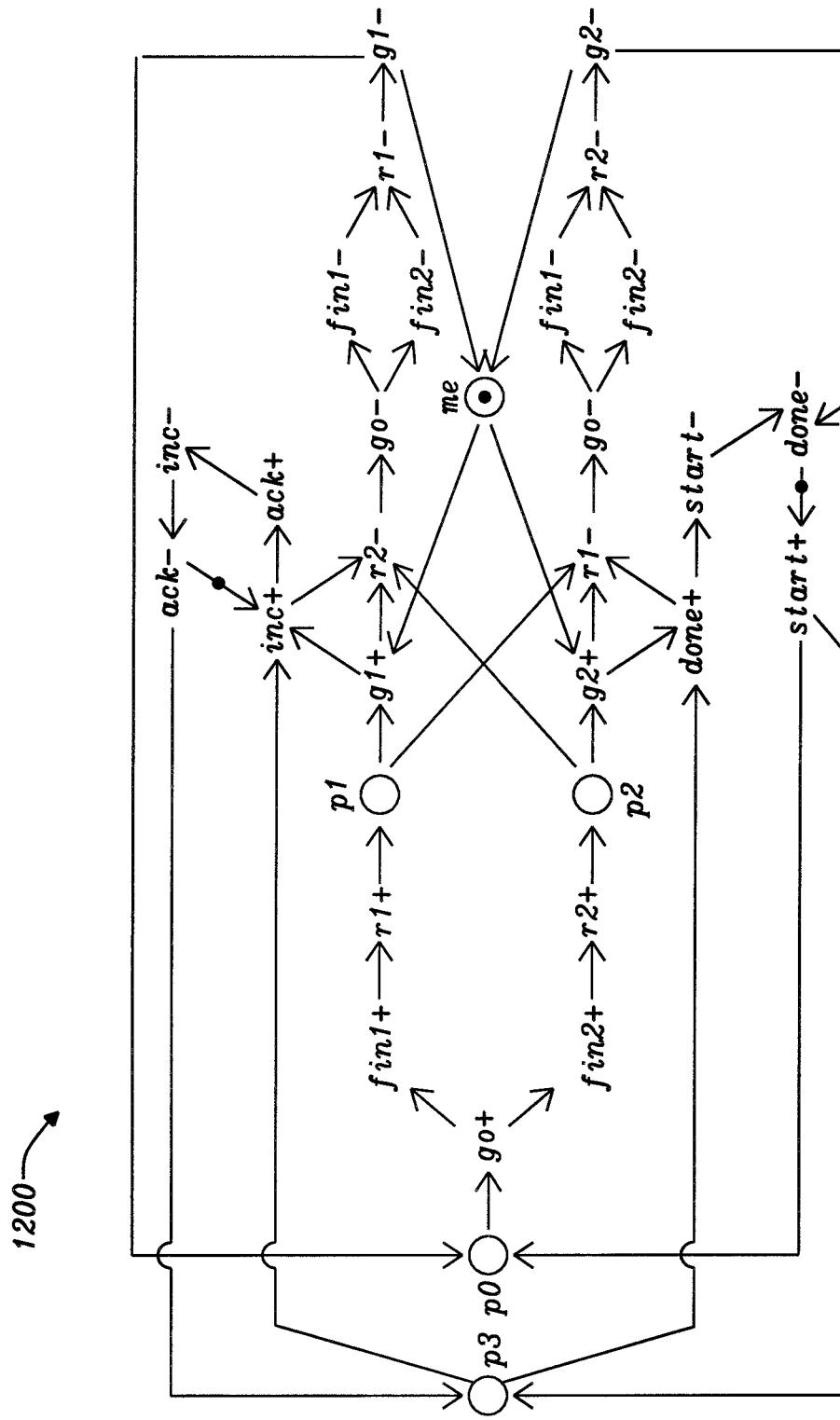
FIG. 12 is an STG specification of the digital sensor of FIG. 11.

FIG. 12 is an STG specification 1200 of the digital sensor 1100. The STG specification 1200 captures the high-level behaviour of the digital sensor 1100 using the notation introduced previously for the asynchronous circuit 700 and in accordance with the skilled person's understanding of STG diagrams and the use of conventional STG notation.

The asynchronous circuit 700 may be implemented using the circuit diagram shown in FIG. 9A to provide a SI implementation of the digital sensor 1100 which functions as a voltage sensor. The digital sensor 1100 is deadlock-free, output-persistent, and conforms (i.e. the circuit will never break the contract with the environment by sending an output that the environment does not expect) to the STG specification 1200 shown in FIG. 12.

Figure 13:
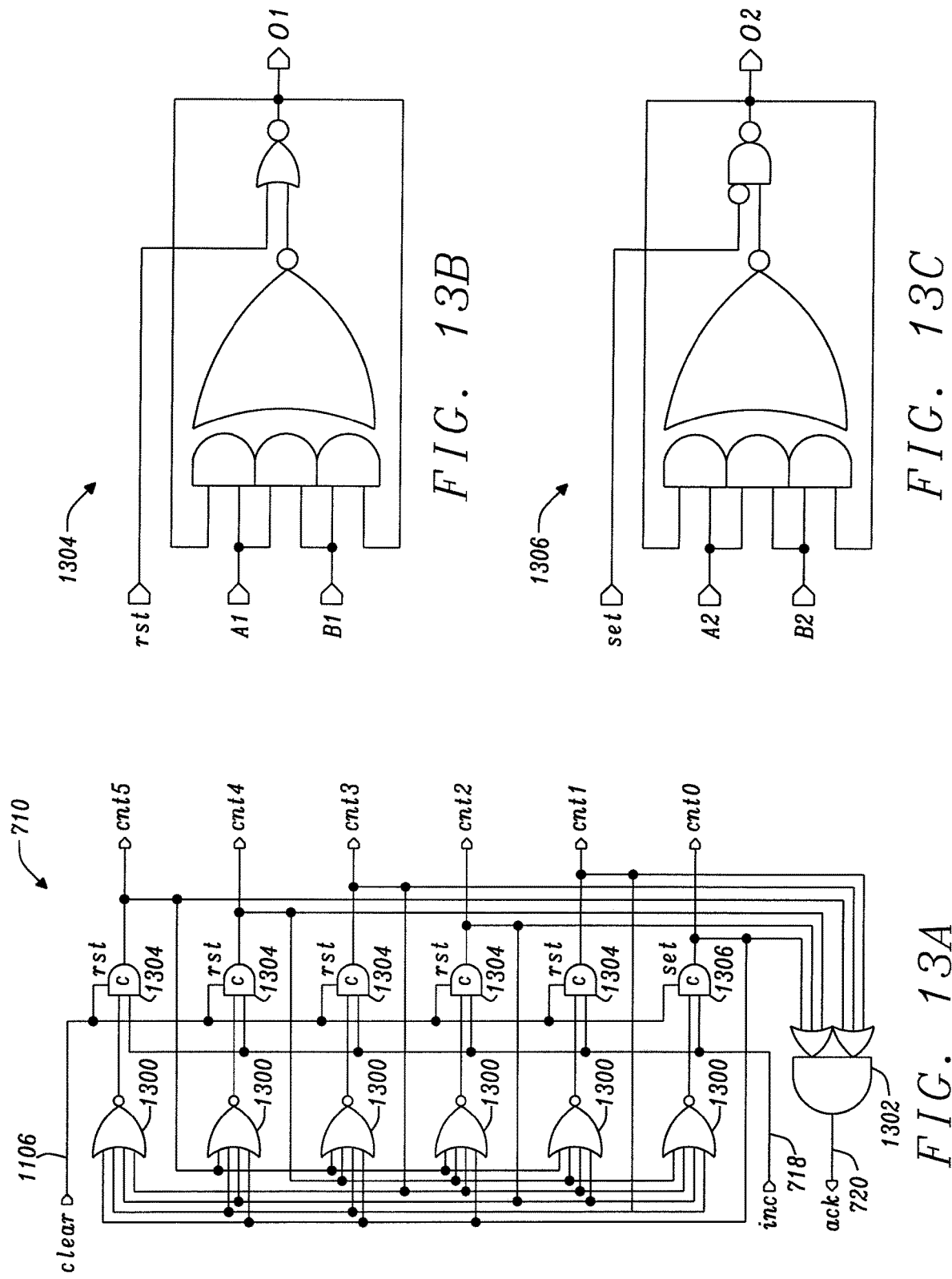
FIG. 13A is a schematic of a possible implementation of an action block configured to function as a counter.
FIG. 13B is a schematic of a possible implementation of a c-element with a reset function.
FIG. 13C is a schematic of a possible implementation of a c-element with a set function.

FIG. 13A is a schematic of a possible implementation of the action block 710 configured to function as the counter. The action block 710 comprises 4-input OR gates with inverted outputs (NOR4) 1300, a OA33 gate 1302, c-elements with reset functions 1304 and a c-element with a set function 1306. The action block 710 receives the initiation signal 1106 (clr) and the request 718 (inc), and provides the acknowledgement 720 (ack) as shown in FIG. 11, and described previously. The c-elements with reset functions 1304 receive a reset signal rst and the c-element with the set function 1306 receives a set signal set.

The action block 710 provides outputs cnt0, cnt1, cnt2, cnt3, cnt4, cnt5 to indicate the number of times that the counter has been incremented. For example, if the output cnt0 is a high signal then there have been no increments of the counter, all other outputs cnt1, cnt2, cnt3, cnt4, cnt5 will be low signals. If the output cnt3 is a high signal and the other outputs cnt0, cnt1, cnt2, cnt4, cnt5 are low signals, then the counter has been incremented three times. It will be clear to the skilled person how the action block 710 may be modified to function as a counter for recording more than five increments. It should be noted that the outputs cnt0, cnt1, cnt2, cnt3, cnt4, cnt5 have been omitted from the schematic of the digital sensor 1100 in FIG. 11 to simplify the schematic.

FIG. 13B is a schematic of a possible implementation of the c-elements with reset functions 1304. The c-elements with reset functions 1304 comprise logic gates 1308, 1310. The c-elements with reset functions 1304 receive inputs A1, B1 and provide output O1. The output O1 may correspond to one of the outputs cnt1, cnt2, cnt3, cnt4, cnt5.

FIG. 13C is a schematic of a possible implementation of the c-elements with the set function 1306. The c-element with the set function 1306 comprise logic gates 1312, 1314. The c-element with the set functions 1306 receive inputs A2, B2 and provide output O2. The output O2 may correspond to the outputs cnt0.

In a further embodiment, the digital sensor 1100 may be modified to function as a capacitance sensor in accordance with the understanding of the skilled person. In such an embodiment the first voltage Va would be a stable supply voltage, the capacitor 1102 would be fully charged prior to switching the switch 1104 to couple the capacitor 1102 to the logic block 702 and starting the racing process. The value recorded by incrementation of the counter would be monotonous (linear) on the capacitance of the capacitor 1102.

Figure 14:
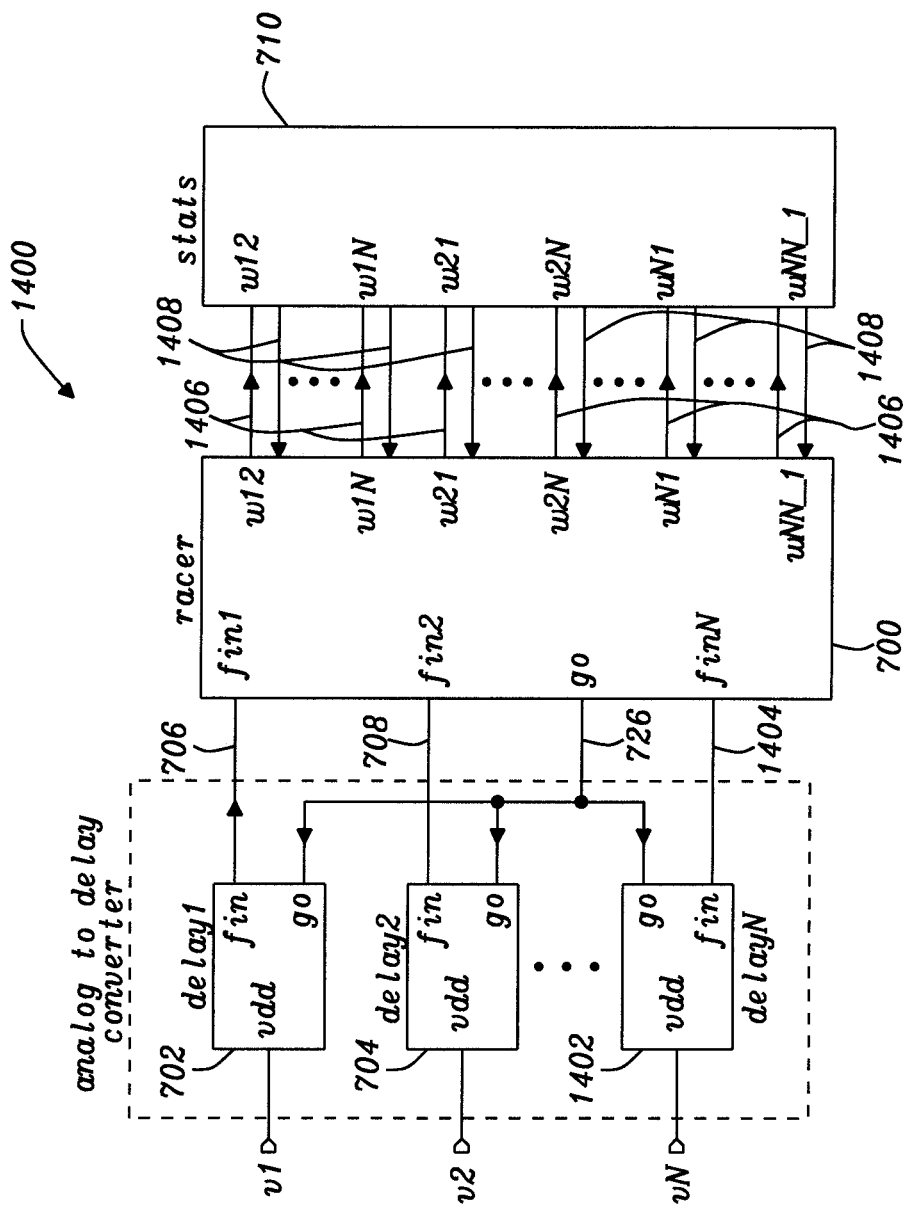
FIG. 14 is a schematic of a digital sensor in accordance with a seventh embodiment of the present disclosure.

FIG. 14 is a schematic of a digital sensor 1400 in accordance with a seventh embodiment of the present disclosure. The digital sensor 1400 is a specific embodiment of the digital sensor 1000 configured to rank a plurality of voltages. In the example shown there are N voltages where N is an integer. The voltages comprise voltage v1 to voltage vN, where voltage vN is the N-th voltage. As such, the analog values compared by the digital sensor comprise voltages v1 to vN. Shown in FIG. 14 are the voltages v1, v2, vN. Therefore, to simplify the following description, reference will be made only to the voltages v1, v2, vN but it will be appreciated that if N is greater than three, then there will be further voltages that are compared. The digital sensor 1400 shares features with the digital sensor 1000 and therefore common features between figures share common reference numerals and variables.

The digital sensor 1400 comprises an N-th logic block 1402 and compared to the digital sensor 1100 comprises a single action block 710. As discussed previously, it will be appreciated that a single action block is sufficient to serve the purpose of receiving and acknowledging different requests. The N-th input signal 1404 is provided by the logic block 1402.

Each logic block 702, 704 and 1402 is coupled the voltages v1, v2 and vN, respectively. The voltages v1, v2 and vN are to be compared and the action triggered with the selection of each transitioning input signal is a recording of that input signal having transitioned by the action block 710. The asynchronous circuit 700 in the digital sensor 1400 provides the requests 1406 to the action block 710 and receives the acknowledgements 1408. Each of the requests 1406 and acknowledgements 1408 are associated with a different one of the input signals as each input signal triggers a different action, corresponding to the recording of that input signal having transitioned. As that transitioning time of an input signal is dependent on the voltage that it receives, it is possible to rank the voltages v1, v2, vN by size by recording the order in which the input signals transition 706, 708, 1404.

The voltage v1 may be provided to the logic block 702 as its supply voltage. The voltage v2 may be provided to the logic block 704 as its supply voltage. The voltage vN may be provided to the N-th logic block 1402 as its supply voltage.

The output provided by the action block 710 is a triangular Boolean matrix (Wij), $1 \leq i < j \leq N$ such that Wij=0 if vi is lower than vj and Wij=1 otherwise. i and j are integers. The races may be performed continuously, with the rankings being latched by the action block 710, functioning as a stats module, until the next race is complete.

In a further embodiment of the digital sensor 1400 there may only be a single acknowledgement 1408 that is provided after all actions performed by the action block 710 have been completed.

Alternatively, in another embodiment of the digital sensor 1400 acknowledgements 1408 may be shared by more than one request 1406. For example, two requests 1406 may trigger two different actions, and upon completion of both actions a single acknowledgement signal 1408 may be provided to the asynchronous circuit 700 by the action block 710.

In a further embodiment, voltages may be ranked by comparing all possible pairs of a plurality of voltages using multiple asynchronous circuit 700. For comparing n voltages there would be a requirement of having $n \times (n-1)/2$ asynchronous circuit 700 comprising two inputs. The asynchronous circuits 700 may be arranged in a triangular matrix format.

Figure 15:
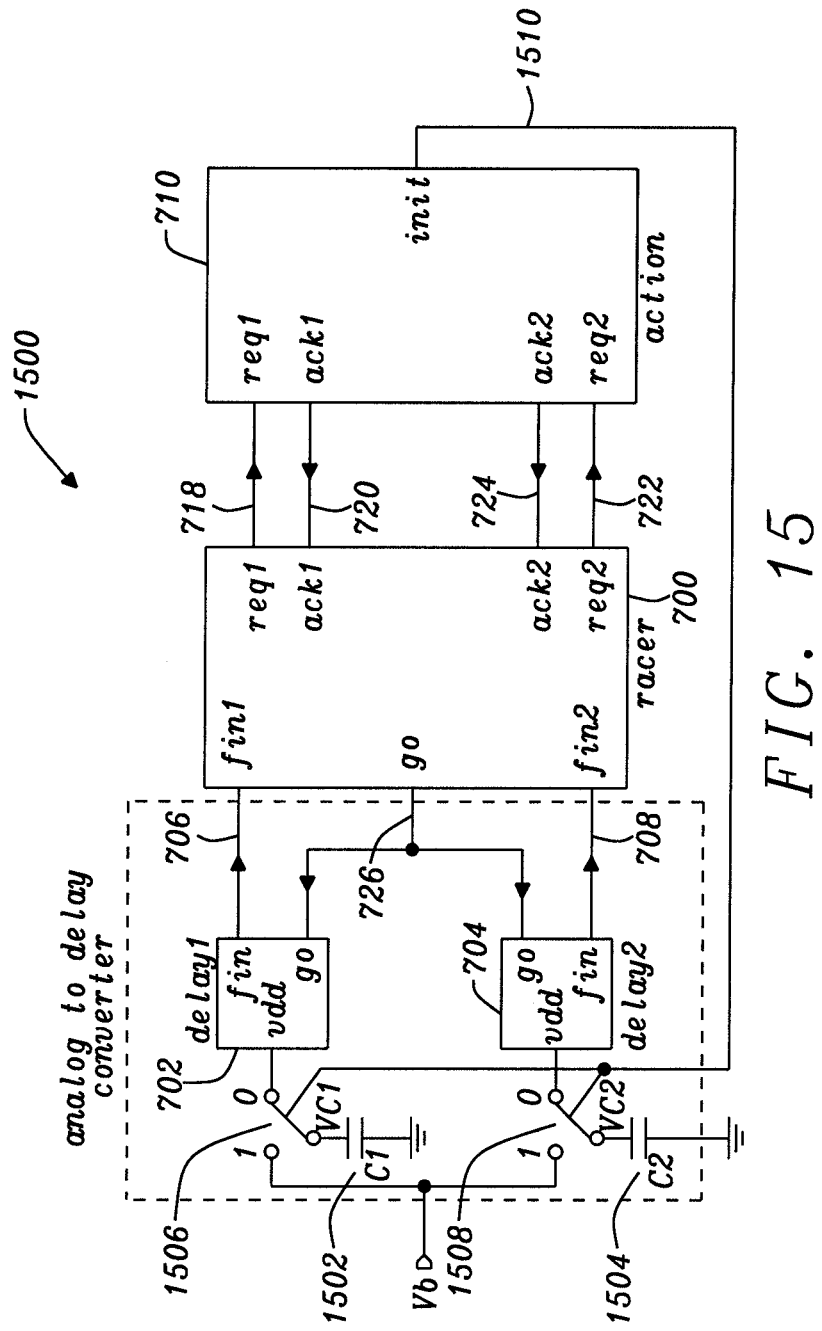
FIG. 15 is a schematic of a digital sensor in accordance with an eighth embodiment of the present disclosure.

FIG. 15 is a schematic of a digital sensor 1500 in accordance with an eighth embodiment of the present disclosure. The digital sensor 1500 is a specific embodiment of the digital sensor 1000 configured to function as a capacitance comparator by comparing a first capacitance C1 with a second capacitance C2, where the capacitances C1 and C2 are the capacitances of a capacitor 1502 and a capacitor 1504, respectively. As such, the analog values compared by the digital sensor 1500 comprise the first capacitance C1 and the second capacitance C2. The digital sensor 1500 shares features with the digital sensor 1000 and therefore common features between figures share common reference numerals and variables.

The plurality of input signals comprises the input signal 706 and the input signal 708. The input signal 706 is received from the logic block 702 and the input signal 706 is received from the logic block 704.

Prior to operation, the capacitors 1502, 1504 are charged by a voltage Vb. The capacitors 1502, 1504 are coupled to the voltage Vb for a relatively short time interval to ensure that they are not fully charged. The capacitors 1502, 1504 are initially coupled to the voltage Vb via their respective switches 1506, 1508.

During operation, the switches 1506, 1508 switch such that the logic block 702 is coupled to the capacitor 1502 and the logic block 704 is coupled to the capacitor 1504. The capacitor 1502 has the capacitance C1 and is configured to hold a capacitor voltage VC1. The delayed first transition of the input signal 702 is dependent on the capacitor voltage VC1. The capacitor 1504 is configured to hold a capacitor voltage VC2. The delayed first transition of the input signal 708 is dependent on the capacitor voltage VC2.

The capacitor voltage VC1 may be provided to the logic block 702 as its supply voltage and the capacitor voltage VC2 may be provided to the logic block 704 as its supply voltage.

The action 714 (not shown) triggered by selection of the input signal 706 is recording of the input signal 706 as being the first to transition of the input signals 706, 708. The action 716 (not shown) triggered by selection of the input signal 708 is recording of the input signal 708 as being the first to transition of the input signals 706, 708.

The digital sensor 1500 compares the capacitor voltages VC1, VC2 by determining which of the input signals 706, 708 transitions first. The result is communicated to the action block 710 via the requests (718 or 722).

The racing process may be repeated by the action block 710 sending an initiation signal 1510 (init) to control the switching of the switches 1502, 1504 and the completion of the actions (not shown) that results in an acknowledgement being provided to the asynchronous circuit 700. The initiation signal 1510 (int) provided by the action block 710 comprises a sufficiently long pulse to enable charging of the capacitors 1502, 1504 to a sufficiently high level.

Figure 16:
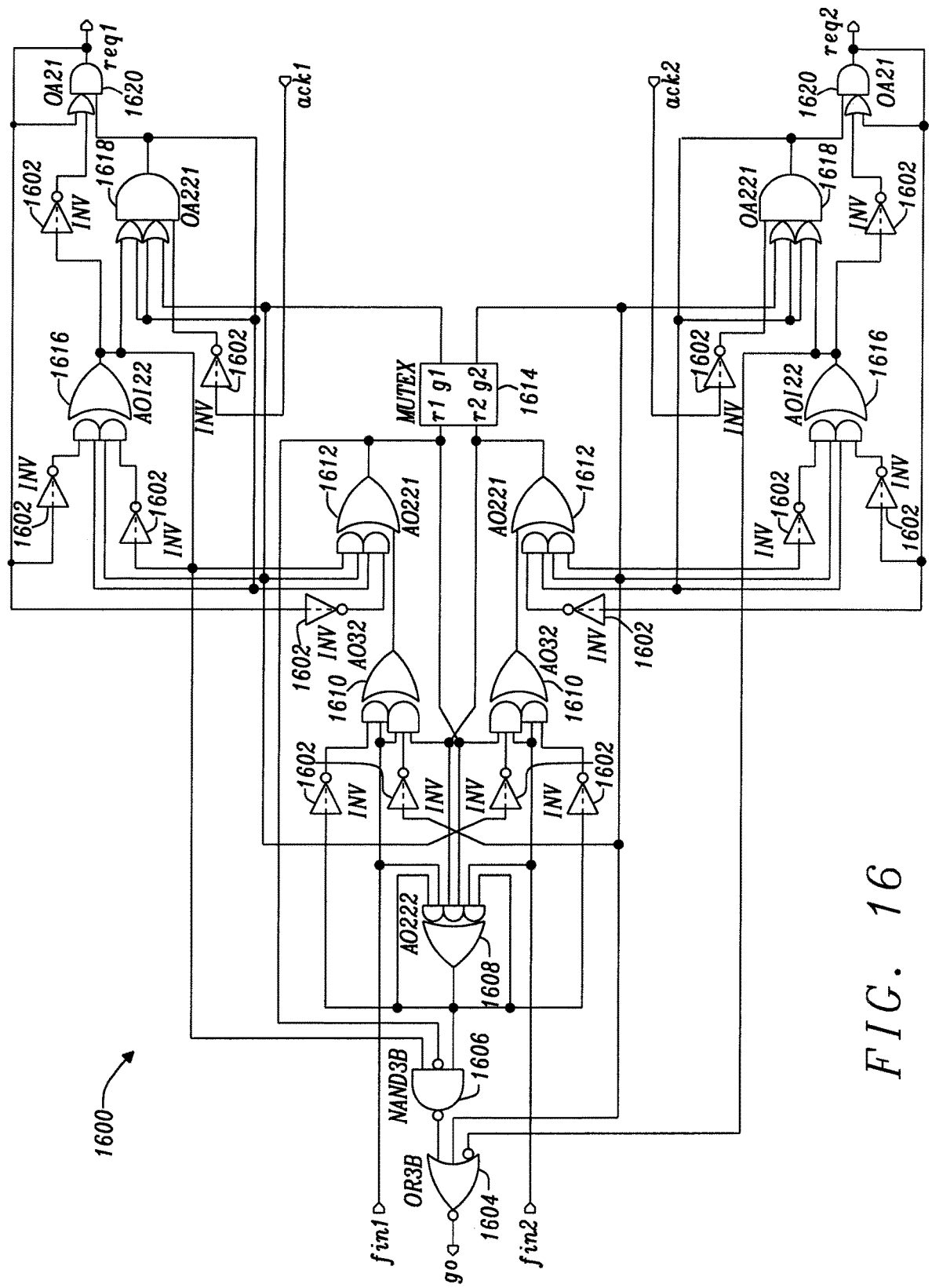
FIG. 16 is a schematic circuit diagram of an asynchronous circuit showing another potential implementation of the asynchronous circuit of FIG. 7 in accordance with a ninth embodiment of the present disclosure.

FIG. 16 is a schematic circuit diagram of an asynchronous circuit 1600 showing a potential physical implementation of the asynchronous circuit 700 in accordance with a ninth embodiment of the present disclosure. The asynchronous circuit 1600 is an alternative to the asynchronous circuit 900 shown in FIG. 9(a). The asynchronous circuit 1600 is symmetric whereas the asynchronous circuit 900 is non-symmetric. A symmetric arrangement simplifies the steps required to modify the asynchronous circuit 1600 to receive multiple input signals. The delay comparator 202 of the prior art is also an example of a non-symmetric circuit.

The asynchronous circuit 1600 comprises inverters 1602, an OR3B gate 1604, a NAND3B gate 1606, an AO222 gate 1608, AO32 gates 1610, AO221 gates 1612, a mutex element 1614, AO122 gates 1616, OA221 gates 1618 and OA21 gates 1620.

Figure 17:
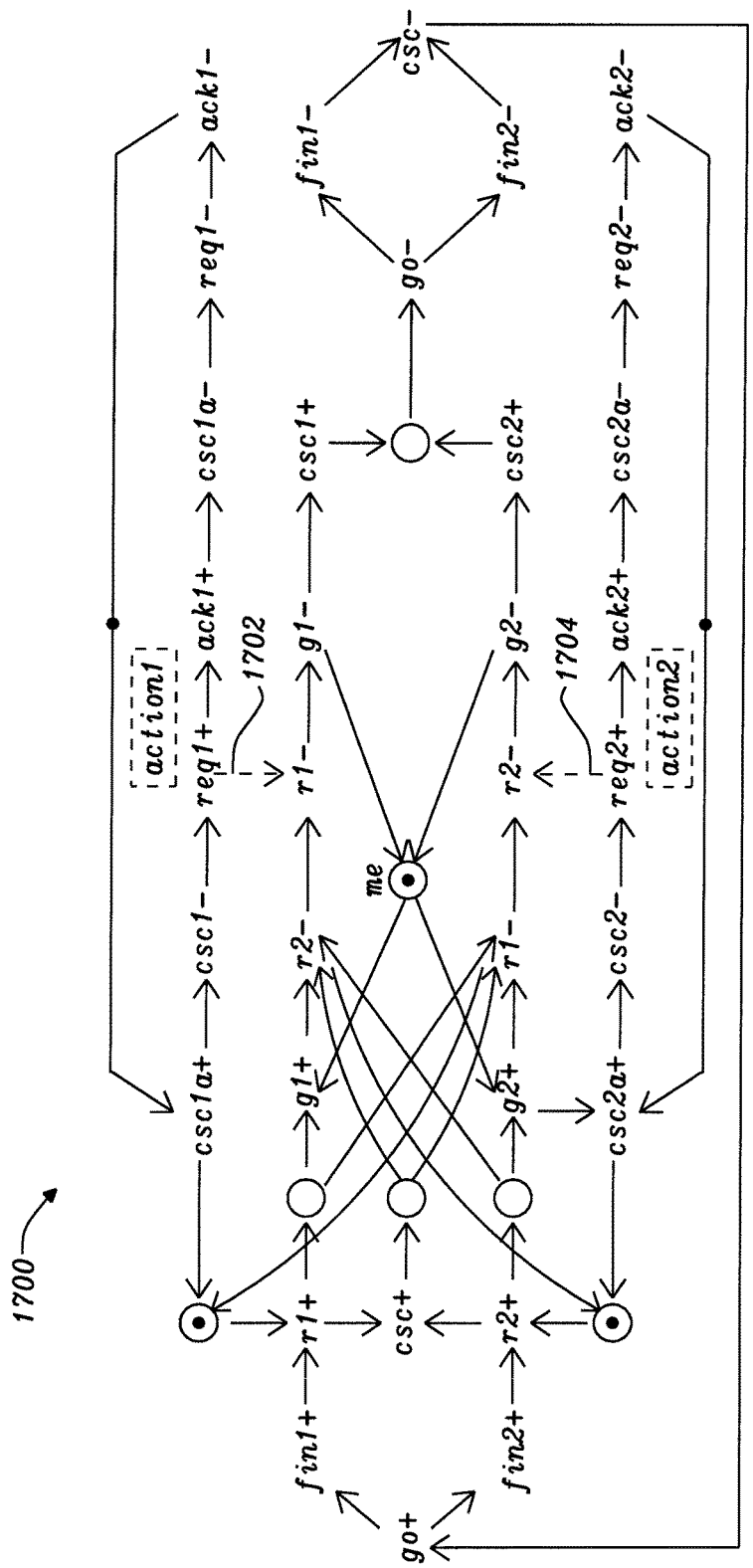
FIG. 17 is an STG specification of the asynchronous circuit of FIG. 16.

FIG. 17 is an STG specification 1700 of the asynchronous circuit 1600. The STG specification 1700 captures the high-level behaviour of the asynchronous circuit 1600 using the notation introduced previously for the asynchronous circuit 700 and in accordance with the skilled person's understanding of STG diagrams and the use of conventional STG notation.

In the STG specification signals csc, csc1, csc1a, csc2, csc2a were inserted to eliminate the cores of CSC conflicts. Additionally, innocuous concurrency reduction was applied as shown by arcs req1+→r1– 1702 and req2+→r2– 1704. Note that this does not restrict the concurrency of action1/action2 to the next race.

The asynchronous circuits disclosed herein provide efficient time comparator circuits that do not require a reference clock signal. Advantages of asynchronous circuit functioning as a racer circuit include low power operation and fully digital arbitration when compared with a circuit using a reference clock signal. Additionally, the asynchronous circuit may be used to provide a physically smaller and lower power alternative to conventional analog to digital converters (ADC).

Various improvements and modifications may be made to the above without departing from the scope of disclosure.

What is claimed is:

1. An asynchronous circuit for requesting that an action is triggered, and configured to perform the following steps:
   1) receive a plurality of input signals, the input signals each having a first transition between states at a different time;
   2) select one of the input signals based on the time of its first transition compared to the time of the first transition of the other input signals;
   3) provide a request to an action block that is configured to:
      i) trigger the action in response to receiving the request; and
      ii) to provide an acknowledgement upon completion of the action;
      wherein: the request and the action are dependent on the input signal that was selected;
   4) receive the acknowledgement from the action block; and
   5) initiate steps 1) to 4) for a second transition of the input signals after the plurality of input signals have undergone their first transitions.

2. The asynchronous circuit of claim 1, wherein in step 3), the request is provided to the action block before any of the other input signals have undergone their first transitions.

3. The asynchronous circuit of claim 1, wherein each input signal is received from a logic block.

4. The asynchronous circuit of claim 3, wherein:
   a digital go signal that exhibits a first transition between states is provided to the logic blocks; and
   the digital go signal is used to generate each of the input signals, such that each of the input signals corresponds to the digital go signal with a delayed first transition resulting from the logic block that outputs the input signal.

5. The asynchronous circuit of claim 4, wherein the digital go signal is provided from the asynchronous circuit.

6. The asynchronous circuit of claim 1, wherein:
   each input signal is received from a logic block;
   a digital go signal that exhibits a first transition between states is provided to the logic blocks;
   the digital go signal is used to generate each of the input signals, such that each of the input signals corresponds to the digital go signal with a delayed first transition resulting from the logic block that outputs the input signal; and
   the digital go signal exhibits a second transition after all input signals have undergone their first transitions, thereby providing the second transitions of the plurality of input signals.

7. The asynchronous circuit of claim 6, wherein the digital go signal is provided from the asynchronous circuit.

8. The asynchronous circuit of claim 1 wherein, the input signal that is selected is a first transitioning input signal, corresponding to:
   i) the input signal that has a first transition between states in a time period that exceeds a threshold delay period before the other input signals undergo their first transitions; or
   ii) the input signal arbitrarily selected from two or more input signals that have first transitions between states before the other input signals, where the time period between the first transitions of the two or more input signals is less that the threshold delay period.

9. The asynchronous circuit of claim 8 comprising:
   a mutex element configured to arbitrarily select the first transitioning input signal from two or more input signals that have first transitions between states before the other input signals, where the time period between the first transitions of the two or more input signals is less that the threshold delay period.

10. The asynchronous circuit of claim 9, wherein after selection of the first transitioning input signal, the other input signals are not provided to the mutex element.

11. The asynchronous circuit of claim 1, wherein upon initiating step 3) for the second transition of the input signals:
   if a different action is to be triggered from a previously triggered action and the acknowledgement indicating that the previously triggered action has completed has not been received, the different action is triggered while the previously triggered action is in process; and/or
   if a same action is to be triggered as the previously triggered action and the acknowledgement indicating that the previously triggered action has completed has not been received, the action is repeated upon completion of the previously triggered action.

12. The asynchronous circuit of claim 1, wherein the action is deemed completed after the action has been in progress for a time period that exceeds a threshold action period.

13. A digital sensor for comparing a plurality of analog values, the digital sensor comprising:
   an asynchronous circuit for requesting that an action is triggered, and configured to perform the following steps:
      1) receive a plurality of input signals, the input signals each having a first transition between states at a different time;
      2) select one of the input signals based on the time of its first transition compared to the time of the first transition of the other input signals;
      3) provide a request to an action block that is configured to:
         i) trigger the action in response to receiving the request; and
         ii) to provide an acknowledgement upon completion of the action; wherein: the request and the action are dependent on the input signal that was selected;
      4) receive the acknowledgement from the action block; and
      5) initiate steps 1) to 4) for a second transition of the input signals after the plurality of input signals have undergone their first transitions;
   wherein:
   each input signal is received from a logic block;

a digital go signal that exhibits a first transition between states is provided to the logic blocks; and the digital go signal is used to generate each of the input signals, such that each of the input signals corresponds to the digital go signal with a delayed first transition resulting from the logic block that outputs the input signal; and each of the logic blocks is configured to receive one of the analog values to be compared, the delayed first transition of the input signal provided by each logic block being dependent on the analog value received by that logic block, such that the delayed first transitions of the input signals are suitable for comparing each of the analog values.

14. The digital sensor of claim 13, wherein in step 3), the request is provided to the action block before any of the other input signals have undergone their first transitions.

15. The digital sensor of claim 13 wherein the analog values comprise at least one of:
voltages;
capacitances; and
temperatures.

16. The digital sensor of claim 13, wherein:
the analog values comprise voltages comprising a first voltage and a reference voltage;
the plurality of input signals comprises a first input signal and a second input signal, the first input signal being received from a first logic block and the second input signal being received from a second logic block;
the first logic block is coupled to a capacitor, the capacitor having a capacitor voltage initially proportional to the first voltage, the delayed first transition of the first input signal being dependent on the capacitor voltage;
the second logic block is coupled to the reference voltage, the delayed first transition of the second input signal being dependent on the reference voltage;
the action triggered by selection of the first input signal is the incrementation of a counter and the partial discharge of the capacitor;
the asynchronous circuit is configured to initiate steps 1) to 4) for one or more later transitions of each of the input signals after the plurality of input signals have undergone their first transitions; and
the number of increments recorded by the counter is suitable for measuring the first voltage.

17. The digital sensor of claim 13, wherein:
the analog values comprise voltages;
each logic block is coupled to one of the voltages to be compared; and
the action triggered with the selection of each transitioning input signal is a recording of that input signal having transitioned.

18. The digital sensor of claim 13, wherein:
the analog values comprise capacitances comprising a first capacitance and a second capacitance;
the plurality of input signals comprises a first input signal and a second input signal, the first input signal being received from a first logic block and the second input signal being received from a second logic block;
the first logic block is coupled to a first capacitor, the first capacitor having the first capacitance and being configured to hold a first capacitor voltage, the delayed first transition of the first input signal being dependent on the first capacitor voltage;
the second logic block is coupled to a second capacitor, the second capacitor being configured to hold a second capacitor voltage, the delayed first transition of the second input signal being dependent on the second capacitor voltage;

the action triggered by selection of the first input signal is recording of the first input signal as being the first to transition of the first and second input signals; and the action triggered by selection of the second input signal is recording of the second input signal as being the first to transition of the first and second input signals.

19. The digital sensor of claim 13, wherein the action is deemed completed after the action has been in progress for a time period that exceeds a threshold action period.

20. A method of operating an asynchronous circuit for requesting that an action is triggered, the method comprising:

1) receiving a plurality of input signals, the input signals each having a first transition between states at a different time;

2) selecting one of the input signals based on the time of its first transition compared to the time of the first transition of the other input signals;

3) providing a request to an action block that:
i) triggers the action in response to receiving the request; and
ii) provides an acknowledgement upon completion of the action;
wherein: the request and the action are dependent on the input signal that was selected;

4) receiving the acknowledgement from the action block; and 5) initiating steps 1) to 4) for a second transition of the input signals after the plurality of input signals have undergone their first transitions.

21. The method of claim 20, wherein in step 3), the request is provided to the action block before any of the other input signals have undergone their first transitions.

22. The method of claim 20, wherein the action is deemed completed after the action has been in progress for a time period that exceeds a threshold action period.

23. A method of comparing a plurality of analog values using a digital sensor, the digital sensor comprising an asynchronous circuit for requesting that an action is triggered, the method comprising:

1) receiving a plurality of input signals at the asynchronous circuit, the input signals each having a first transition between states at a different time;

2) selecting one of the input signals based on the time of its first transition compared to the time of the first transition of the other input signals using the asynchronous circuit;

3) providing from the asynchronous circuit a request to an action block that:
i) triggers the action in response to receiving the request; and
ii) provides an acknowledgement upon completion of the action; wherein: the request and the action are dependent on the input signal that was selected;

4) receiving the acknowledgement from the action block at the asynchronous circuit; and 5) initiating steps 1) to 4) for a second transition of the input signals after the plurality of input signals have undergone their first transitions;

wherein:
each input signal is received from a logic block;
a digital go signal that exhibits a first transition between states is provided to the logic blocks; and the digital go signal is used to generate each of the input signals, such that each of the input signals corresponds to the digital go signal with a delayed first transition resulting from the logic block that outputs the input signal; and each of the logic blocks receives one of the analog values to be compared, the delayed first transition of the input signal provided by each logic blocks being dependent on the analog value received by that logic block, such that the delayed first transitions of the input signals are suitable for comparing each of the analog values.

24. The method of claim 23, wherein in step 3), the request is provided to the action block before any of the other input signals have undergone their first transitions.

25. The method of claim 23, wherein the action is deemed completed after the action has been in progress for a time period that exceeds a threshold action period.

* * * * *